US006397749B1

(12) United States Patent
Kita et al.

(10) Patent No.: US 6,397,749 B1
(45) Date of Patent: Jun. 4, 2002

(54) HEAT-SENSITIVE LITHOGRAPHIC PRINTING PLATE PRECURSOR

(75) Inventors: Nobuyuki Kita; Keiji Akiyama; Hidekazu Oohashi, all of Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 7 days.

(21) Appl. No.: 09/626,490

(22) Filed: Jul. 26, 2000

(30) Foreign Application Priority Data

Jul. 26, 1999 (JP) .......................................... 11-211366
Sep. 1, 1999 (JP) .......................................... 11-247764
Sep. 8, 1999 (JP) .......................................... 11-254508

(51) Int. Cl.$^7$ .............................. B41N 1/08; G03F 7/26
(52) U.S. Cl. ....................... 101/457; 101/462; 101/467; 430/271.1; 430/302
(58) Field of Search ................................ 101/456, 457, 101/460, 462, 463.1, 465, 466, 467; 430/271.1, 273.1, 302

(56) References Cited

U.S. PATENT DOCUMENTS 5,807,658 A * 9/1998 Ellis et al. .................. 101/457
6,014,930 A * 1/2000 Burberry et al. ............ 101/456
6,136,508 A * 10/2000 DeBoer et al. ............. 101/457
6,210,857 B1 * 4/2001 Vermeersch et al. ..... 430/270.1

FOREIGN PATENT DOCUMENTS

| | | | |
|---|---|---|---|
| EP | 683728 | * | 11/1995 |
| WO | WO 94/18005 | * | 8/1994 |
| WO | WO 98/40212 | * | 9/1998 |
| WO | WO 99/19143 | * | 4/1999 |
| WO | WO 99/19144 | * | 4/1999 |

* cited by examiner

*Primary Examiner*—Stephen R. Funk
(74) *Attorney, Agent, or Firm*—Burns, Doane, Swecker & Mathis, LLP

(57) ABSTRACT

A heat-sensitive precursor of lithographic printing plates, which comprises a hydrophilic layer provided on a substrate having an ink-receptive surface or coated with an ink-receptive layer; the printing plate precursor further having a water-soluble overcoat layer on the hydrophilic layer, and the hydrophilic layer being a three-dimensionally cross-linked hydrophilic layer, the heated area of that is easily removed by a fountain solution or ink when subjected to printing operations.

22 Claims, No Drawings

HEAT-SENSITIVE LITHOGRAPHIC PRINTING PLATE PRECURSOR

FIELD OF THE INVENTION

The present invention relates to a heat-sensitive lithographic printing plate precursor, which enables direct platemaking without requiring development-processing and can ensure a long press life for offset printing plates. More specifically, the invention relates to a lithographic printing plate precursor in which images can be recorded by scanning exposure based on digital signals, and which can be loaded in a printing machine after recording the images and subjected to printing operations without undergoing the development of the recorded images with a conventional liquid developer.

BACKGROUND OF THE INVENTION

In general, the lithographic plate is constituted of a oleophilic image area to receive ink in the printing step and a hydrophilic non-image area to receive fountain solution applied thereto prior to the inking step. For making such a lithographic plate, a presensitized plate (abbreviated as "PS plate" hereinafter) comprising a water-wettable (i.e., a hydrophilic) support and an ink-receptive photopolymer layer provided thereon has been widely used as a plate material. In a conventional method adopted for making the desired printing plate from such a PS plate, the exposure is generally carried out via an original such as a litho film, and then the non-image area is dissolved and removed with a developer.

The conventional process of making a printing plate by the use of a PS plate requires a step of removing the non-image area by dissolution after exposure. Of the improvements expected in the conventional arts, it is one subject to make such an additional wet processing unnecessary or simple. Lately in particular, the disposal of the liquid waste discharged with the progress of wet processing has been a matter of great concern of the whole industrial world from the viewpoint of considering global environment. Therefore, the request for improvements in this respect has become even stronger.

The method proposed as one of simple platemaking methods answering to that request comprises utilizing an image recording layer which makes it possible to remove the non-image areas of a printing plate precursor during the general printing process, and carrying out development on a printing machine after exposure, thereby obtaining the final printing plate. The system for making a lithographic printing plate according to the aforementioned method is referred to as a "on-press development" system. As a specific example thereof, mention may be made of the method in which the image recording layer soluble in a fountain solution or an ink solvent is employed and the non-image areas is removed mechanically by contact with the impression cylinder or the blanket cylinder installed in a printing machine. However, the on-press development system according to the conventional ultraviolet or visible light-utilized image recording method has a drawback that the image-recording layer remains unfixed even after exposure. Therefore, such a system requires taking a troublesome measure such that the printing plate precursor is stored in a completely shaded or thermostated condition till it is loaded in a printing machine.

On the other hand, it is another recent trend in this field that the technology to digitize image information has been widely spreading, wherein the image information is electronically processed, stored and outputted by the use of a computer. And a variety of new image-output systems which can keep up with such digitization technology have become practical. Under these circumstances, considerable attention has been devoted to the computer-to-plate technology which enables the direct platemaking to be performed by exposure-scanning the printing plate precursor with highly directional radiant rays, such as laser beams, carrying the digitized image information, but not using a litho film. And the production of printing plate precursors suitable for such technology has been one of important technical problems.

Accordingly, the needs for simplifying platemaking operations and performing them in a dry process or without processing have become much stronger than usual in both fields of environmental protection and adaptation to digitization.

Of the platemaking methods using scanning exposure in which the digitization techniques are easy to incorporate, the especially promising method is a platemaking method utilizing as an image-recording means a high-output solid-state laser device, such as a semiconductor laser device or a YAG laser device, because such a device has lately become available at a low price. In the conventional platemaking method, the imagewise exposure of low to medium illumination intensity is given to a photosensitive printing plate precursor, and thereby the photochemical reaction is caused imagewise at the printing plate precursor surface. As a result, the printing plate precursor surface causes an imagewise change in physical property to record the image. On the other hand, in the method of using high energy density exposure, such as exposure with a high-output laser device, the area to be exposed undergoes instant concentrated exposure to the light with a large quantity of energy, resulting in efficient conversion of the energy of exposure light to thermal energy. This thermal energy causes various thermal changes, such as chemical change, phase change and changes in form and structure, and these changes are utilized for recording images. In other words, the image information is input with light energy, such as laser beams, but the images are recorded via the reaction caused by thermal energy. In general such a high energy density exposure-utilized recording system is referred to as heat mode recording, and the conversion of light energy to heat energy is referred to as light-heat conversion.

The platemaking method utilizing a heat mode recording means has a great advantage in that the heat mode sensitive materials are in a substantial sense insensitive to light of ordinary illumination intensity and the fixation is not always essential to the images recorded by high illumination intensity exposure. In other words, in a case where the heat mode sensitive materials are used for recording images, they are safe from indoor light before exposure, and besides, they do not always require the fixation of images after exposure. Therefore, if the image recording layer of the type which can be made either soluble or insoluble by heat mode exposure is used and the on-press development system is adopted into the platemaking step of removing imagewise the exposed image recording layer, it becomes possible for the graphic arts system to have recorded images which are not affected by the development (the removal of non-image areas) performed after the exposed image recording layer is exposed to indoor light for a while.

Thus, it is expected that the utilization of heat mode recording makes it possible to design lithographic printing plate precursors suitable for the on-press development system.

As a desirable method of making a lithographic printing plate on a basis of heat mode recording, there is a proposal on the method, wherein the hydrophobic image recording layer provided on a hydrophilic substrate is subjected to heat mode exposure to change its solubility or dispersibility and, if needed, the non-image areas are removed by wet development.

As examples of a lithographic printing plate precursor usable in the method proposed, JP-B-46-27919 (the term "JP-B" as used herein means an "examined Japanese patent publication") discloses the printing plate precursors for heat mode recording which each have on a hydrophilic support a recording layer whose solubility is heightened by heat, or the so-called positively working recording layer, more specifically a recording layer having a particular composition in which saccharides or melamine-formaldehyde resin is comprised.

However, each of the recording layers disclosed has insufficient thermal sensitivity, and so the sensitivity thereof is insufficient for heat mode scanning exposure. In addition, it has a practical problem that it shows small discrimination between hydrophobicity and hydrophilicity, or a small change in solubility, before and after exposure. If the discrimination is scarce, it is substantially difficult to make printing plates by use of the on-press development system.

Further, WO98/40212 discloses the lithographic printing plate precursor that has a hydrophilic layer comprising transition metal oxide colloid on a substrate coated with an ink-receptive layer comprising a light-heat converting agent and enables the platemaking without development. Therein, the hydrophilic layer comprising transition metal oxide colloid is ablated by the heat evolved by the light-heat converting agent in the exposed areas. Since the light-heat converting agent is present on the substrate side, however, the heat converted from the absorbed light is emitted into the substrate also, and so it cannot be used effectively for the ablation of the hydrophilic layer comprising the colloid. Therefore, such a plate precursor has a drawback of being low in sensitivity. In addition, JP-A-55-105560 (the term "JP-A" as used herein means an "unexamined published Japanese patent application") and W94/18005 each disclose the lithographic printing plate precursor having the hydrophilic layer capable of undergoing ablation similarly to the above on the substrate coated with an oleophilic light-to-heat conversion layer. These precursors also have low sensitivity for the same reason as mentioned above.

For the purpose of improving the drawback of being low in sensitivity to the thermally ablatable heat-sensitive lithographic printing plate precursors as described above, the lithographic printing plate precursors containing a light-heat converting agent in a hydrophilic colloid layer as the upper layer are disclosed in WO99/19143 and WO99/19144. Those printing plate precursors increase in sensitivity, indeed, but the light-heat converting agent added to the hydrophilic layer lowers the film quality of the hydrophilic layer to decrease the impression capacity or, in some cases, spoils the hydrophilic properties of the hydrophilic layer to cause a new problem that the non-image areas comes to be stained with ink during printing operations.

Further, those conventional ablation-utilizing heat-sensitive precursors of lithographic printing plates have another problem that the ablation scum scatters to cause the pollution of a laser exposure apparatus and an optical system, thereby lowering the resolving power, and further the scum scatters to the outside of the apparatus.

European Patent 0816070 has a description of ablation control. According to this patent, the heat-sensitive recording element has the hydrophilic polymer-containing water-soluble or water-swellable protective layer on the image-forming layer that is provided on a hydrophilic support and comprises hydrophobic thermoplastic polymer particles and a light-heat converting agent in a condition that they are dispersed in a hydrophilic binder. And the protective layer provided on the image-forming layer controls ablation. However, the image recording method adopted by the patent described above consists in that the hydrophobic thermoplastic polymer particles are made molten by heat evolved upon irradiation with laser to render the image forming layer insoluble in water and the laser unirradiated area is dissolved and removed by development with water or an aqueous solution to leave the irradiated area as image area. Therein, the ablation secondarily occurring in parallel with the thermal melting of polymer particles in the irradiated area spoils the image area to cause deterioration of printing quality. Such being the case, the protective layer functions so as to control this ablation. By contrast, the ablation method consists in the removal of laser-irradiated area by ablation, as a result, the generation of scum is unavoidable in the ablation method. As a scum-scatter control measure, therefore, it has so far been carried out to install an ablation scum trap on the exposure apparatus. However, the scum pollution is difficult to completely avoid even when the trap is installed.

While the graphic arts system utilizing heat-mode image recording has advantages in that the machine plate can be made directly from a camera-ready copy without any film, so the platemaking can be effected on a machine, and the development operations can be omitted, it has also disadvantages as mentioned above.

SUMMARY OF THE INVENTION

Therefore, an object of the invention is to solve the problems of conventional heat-mode platemaking methods using laser irradiation for recording images. More specifically, one object of the invention is to provide a heat-sensitive lithographic printing plate precursor which has short-duration scanning exposure suitability, can be loaded directly in a printing machine without undergoing development and subjected to printing operations, and ensures high press life and no scumming (i.e., no staining) for the lithographic printing plate.

Another object of the invention is to provide a heat-sensitive lithographic printing plate precursor which enables the ablation (scatter) of its heat-sensitive layer to be controlled upon exposure to laser beams, thereby decreasing the pollution of the exposure apparatus and the optical system including a light source.

Still another object of the invention is to provide a heat-sensitive lithographic printing plate precursor which enables utilization of ablation as an image-forming means without deterioration of printing plate properties, including a decrease in sensitivity, and can control the scatter of ablation scum from the heat-sensitive layer when exposed to laser beams, thereby ensuring reduced pollution for the exposure apparatus and the optical system.

As a result of our intensive studies on the aforementioned subjects, it has been found that the formation of a water-soluble overcoat layer on a hydrophilic layer can control the scatter of the hydrophilic layer at the time of ablation without adversely affecting the sensitivity, the impression capacity, the printing suitability and the on-press development suitability. Further, it has been discovered that when a water-soluble overcoat layer containing a light-heat converting agent is provided as the topmost layer over a hydrophilic layer, the high sensitivity can be maintained without lowering of impression capacity and printing suitability and the ablation (scatter) of the hydrophilic layer can be controlled. Based on these discoveries, the invention has been achieved.

More specifically, the following are embodiments of the invention:

1. A heat-sensitive lithographic printing plate precursor comprising a hydrophilic layer provided on a substrate having an ink-receptive surface or coated with an ink-receptive layer; with the printing plate precursor further having a water-soluble overcoat layer on the hydrophilic layer, and the hydrophilic layer being a three-dimensionally cross-linked hydrophilic layer, the heated area of that is easily removed by a fountain solution or ink when subjected to printing operations.
2. The heat-sensitive lithographic printing plate precursor according to Embodiment 1, wherein said overcoat layer comprises a light-heat converting agent.
3. The heat-sensitive lithographic printing plate precursor according to Embodiment 1 or 2, wherein at least one of the hydrophilic layer and the ink-receptive layer comprises a light-heat converting agent.
4. The heat-sensitive lithographic printing plate precursor according to Embodiment 1, 2 or 3, wherein the cross-linked hydrophilic layer comprises a colloid of at least one compound selected from the group consisting of oxides or hydroxides of beryllium, magnesium, aluminum, silicon, titanium, boron, germanium, tin, zirconium, iron, vanadium, antimony and transition metals.
5. The heat-sensitive lithographic printing plate precursor according to Embodiment 1, 2 or 3; wherein the cross-linked hydrophilic layer comprises a colloid of at least one compound selected from the group consisting of oxides or hydroxides of beryllium, magnesium, aluminum, silicon, titanium, boron, germanium, tin, zirconium, iron, vanadium, antimony and transition metals, and a hydrophilic resin.
6. The heat-sensitive lithographic printing plate precursor according to Embodiment 1, 2 or 3, wherein cross-linked hydrophilic layer comprises a colloid of at least one compound selected from the group consisting of oxides or hydroxides of beryllium, magnesium, aluminum, silicon, titanium, boron, germanium, tin, zirconium, iron, vanadium, antimony and transition metals, and a cross-linking agent for the colloid.
7. The heat-sensitive lithographic printing plate precursor according to Embodiment 1, 2 or 3; wherein the cross-linked hydrophilic layer comprises a colloid of at least one compound selected from the group consisting of the oxides or the hydroxides of beryllium, magnesium, aluminum, silicon, titanium, boron, germanium, tin, zirconium, iron, vanadium, antimony and transition metals, a hydrophilic resin and a cross-linking agent for the colloid.
8. The heat-sensitive lithographic printing plate precursor according to Embodiment 5 or 7, wherein the hydrophilic resin is a high molecular compound having hydroxyl groups or carboxyl groups.
9. The heat-sensitive lithographic printing plate precursor according to Embodiment 5 or 7, wherein the hydrophilic resin is a hydroxyalkylacrylate homo- or copolymer, or a hydroxyalkylmethacrylate homo- or copolymer.
10. The heat-sensitive lithographic printing plate precursor according to Embodiment 6 or 7, wherein the cross-linking agent is an initial hydrolytic condensation product of tetraalkoxysilane, trialkoxysilylpropyl-N,N,N-trialkyl-ammonium halide or aminopropyltrialkoxysilane.
11. The heat-sensitive lithographic printing plate precursor according to any of Embodiments 4 to 10, wherein the colloid is a sol comprising a hydrolytic condensation product of dialkoxysilane, trialkoxysilane, tetraalkoxysilane or a mixture thereof.
12. The heat-sensitive lithographic printing plate precursor according to any of Embodiments 4 to 10, wherein the colloid is a sol comprising a hydrolytic condensation product of aluminum, titanium or zirconium tetraalkoxide.
13. The heat-sensitive lithographic printing plate precursor according to any of Embodiments 4 to 10, wherein the colloid is a colloid containing an organic solvent solution.
14. The heat-sensitive lithographic printing plate precursor according to Embodiment 13, wherein the organic solvent is methanol or ethanol.
15. The heat-sensitive lithographic printing plate precursor according to Embodiment 1, 2 or 3, wherein the substrate is a polyethylene terephthalate or polycarbonate film.
16. The heat-sensitive lithographic printing plate precursor according to Embodiment 1, 2 or 3, wherein the substrate is an aluminum or steel sheet coated with an ink-receptive organic high molecular resin.
17. The heat-sensitive lithographic printing plate precursor according to Embodiment 1, 2 or 3, wherein the substrate is an aluminum or steel sheet laminated with an oleophilic plastic film.
18. The heat-sensitive lithographic printing plate precursor according to Embodiment 1, 2 or 3, wherein the substrate is a paper coated with an ink-receptive organic polymer or a paper laminated with an oleophilic plastic film.
19. The heat-sensitive lithographic printing plate precursor according to Embodiment 1, 2 or 3, wherein the overcoat layer comprises a light-heat converting agent and a water-soluble resin.
20. The heat-sensitive lithographic printing plate precursor according to Embodiment 2, wherein the light-heat converting agent is a water-soluble dye having absorption in the infrared region or a pigment having the surface covered with a water-soluble compound.
21. The heat-sensitive lithographic printing plate precursor according to Embodiment 20, wherein the water-soluble dye is a cyanine dye having at least one group selected from the group consisting of sulfonic acid group, alkali metal salts thereof and amine salt thereof.
22. The heat-sensitive lithographic printing plate precursor according to Embodiment 1, 2 or 3, wherein the overcoat layer has a thickness of from 0.05 to 4.0 $\mu$m.
23. The heat-sensitive lithographic printing plate precursor according to Embodiment 1, 2 or 3, wherein the cross-linked hydrophilic layer has a thickness of from 0.1 to 3 $\mu$m.

In accordance with embodiments of the invention, the light-heat converting agent incorporated in the overcoat layer evolves heat upon exposure to laser beams, and the heat evolved converts the three-dimensionally cross-linked hydrophilic layer present underneath the overcoat layer into such a state as not to develop into ablation (scatter) owing to the presence of the overcoat layer but to be easily removed by a fountain solution or ink used later. And the area which has undergone conversion by the heat is released (i.e., peeled) from the ink-receptive layer present underneath, thereby forming the image area. Although the details of such a mechanism have not been proven yet, the invention expresses the phenomenon described above in the phrase "ablation-like removal or release". Actually, the ablation (scatter) of the hydrophilic layer is controlled by the overcoat layer present as the upper layer, and seemingly the adhesion of the hydrophilic layer to the ink-receptive layer is lowered to enable the image formation at the time of printing.

In the invention, the hydrophilic layer which has caused ablation-like release from the ink-receptive layer is removed by a fountain solution or ink at the time of printing. Naturally enough, the overcoat layer is removed by a fountain solution prior to the removal of the released (i.e., peeled) area of the hydrophilic layer. At the same time as the removal of the overcoat layer, the hydrophilic layer in the state of ablation-like release may be removed. When the hydrophilic layer is removed, the ink-receptive layer as the underlayer thereof appears, and forms the image area. On the other hand, the unexposed area of the printing plate precursor remains as it is hydrophilic, and so it receives water and repels ink. In this way, the exposed printing plate precursor is developed on a printing machine, and at the same time it can undergo printing operations. In the platemaking, the present printing plate requires no wet-processing with a developer in contrast to conventional lithographic printing plates. In other words, the lithographic printing plate can be made without processing.

For a period from the exposure of a printing plate precursor to the installation of the printing plate in a printing machine, it frequently happens that the printing plate is allowed to stand in the air for many hours or handled with ink-stained hands to result in adhesion of oleophilic substances to the printing plate surface. However, the invention protects the hydrophilic layer, which becomes the non-image area, against the adhesion of oleophilic substances by providing the water-soluble overcoat layer as the topmost layer, so that the scumming does not develop at the time of printing.

Further, the addition of a light-heat converting agent to the overcoat layer enables the heat generating therein to be transmitted directly to the hydrophilic layer provided underneath the overcoat layer, and so the heat evolved can be utilized at almost the same efficiency as in the case where the agent is added to the hydrophilic layer. As a result, almost no decrease in sensitivity takes place in the invention. Accordingly, it becomes possible in the invention to control the scatter of the hydrophilic layer caused by ablation as the sensitivity is maintained. By controlling the scatter caused by the ablation, the laser exposure apparatus and the optical system including a light source become free of pollution, and so the installation of any particular ablation scum catcher on the apparatus becomes unnecessary.

Therefore, the basic problems of the processing-free direct printing plate are solved at the same time by providing the overcoat layer.

As already mentioned, for a period from the exposure of a printing plate precursor to the installation of the printing plate in a printing machine, it frequently happens that the printing plate is allowed to stand in the air for many hours or handled with ink-stained hands to result in adhesion of oleophilic substances to the plate surface. As to the protective measure against such pollution by adhesion of oleophilic substances in conventional systems carrying out development-processing, the plate surface is protected by being covered with a water-soluble substance in the gumming step as the final step of the process. On the other hand, the processing-free printing plates have never taken such a pollution-control measure; as a result, the hydrophilic surface layer is polluted directly, and the scumming tends to develop. In accordance with the invention, however, the hydrophilic layer, which becomes the non-image area, is protected against the adhesion of oleophilic substances by the water-soluble overcoat layer provided as the topmost layer, so that the scumming does not develop at the time of printing.

In this way, the other basic problem carried by the processing-free direct printing plates can also be solved at the same time by providing the overcoat layer.

DETAILED DESCRIPTION OF THE INVENTION

The modes for carrying out the invention are illustrated below in detail.

The water-soluble overcoat layer used in the invention can be removed easily at the time of printing, and contains a resin selected from water-soluble organic or inorganic high molecular compounds. The water-soluble organic or inorganic resins (high molecular compounds) usable herein are resins capable of forming films when coated and dried, with examples including polyvinyl acetate (having a hydrolysis rate of at least 65%), polyacrylic acid and alkali metal or amine salts thereof, polyacrylic acid copolymers and alkali metal or amine salts thereof, polymethacrylic acid and alkali metal or amine salts thereof, polymethacrylic acid copolymer and alkali metal or amine salts thereof, polyacrylamide and polyacrylamide copolymers, polyhydroxyethyl acrylate, polyvinylpyrrolidone and polyvinylpyrrolidone copolymers, poly(vinyl methyl ether), polyvinyl methyl ether-maleic anhydride copolymer, poly(2-acrylamido-2-methyl-1-propanesulfonic acid) and alkali metal or amine salts thereof, poly-2-acrylamido-2-methyl-1-propanesulfonic acid copolymers and alkali metal or amine salts thereof, gum arabic, cellulose derivatives (such as carboxymethyl cellulose, carboxyethyl cellulose and methyl cellulose) and modifications thereof, white dextrin, pullulan and enzyme-decomposed etherified dextrin. These resins may be used as a mixture of two or more thereof depending on the desired purpose.

Further, in the present invention, the light-heat converting agent may be contained in the water-soluble overcoat layer, and further at the same time, the light-heat converting agent may be contained in the hydrophilic layer and/or ink receiving layer. Or, the light-heat converting agent may be contained in the hydrophilic layer and/or ink receiving layer, and further at the same time, the light-heat converting agent may be contained in the water-soluble overcoat layer.

The light-heat converting agent used in the invention may be substances capable of absorbing light of 700 nm or longer wavelengths, and so various kinds of pigments and dyes are usable. Examples of pigments usable as the foregoing agent include commercially available pigments and the pigments described in *Colour Index* (C.I.) *Handbook, Saishin Ganryo Binran* (which means "*Newest Handbook of Pigments*"), compiled by Nippon Ganryo Gijutu Kyokai, published in 1977, *Saishin Ganryo Ohyo Gijutu* (which means "*Newest Application Arts of Pigments*"), published by CMC Shuppan in 1986, and *Insatu Ink Gijutu* (which means "*Techniques for Printing Ink*"), published by CMC Shuppan in 1984.

As to the type of pigment, black pigments, brown pigments, red pigments, violet pigments, blue pigments, green pigments, fluorescent pigments, metallic powder pigments and polymer-bonded dyes are exemplified. Specifically, examples of the usable pigments include insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments and carbon black.

These pigments may be used without surface treatment, or after undergoing surface treatment. Examples of a surface treatment method include the method of coating hydrophilic or oleophilic resin on the pigment surface, the method of making a surfactant adhere to the pigment surface, and the method of making a reactive substance (e.g., a silica sol, an aluminum sol, a silane coupling agent, an epoxy compound, polyisocyanate compound) bond to the pigment surface. These surface treatment methods are described in *Kinzoku Sekken no Seishitu to Ohyo* (which means "Properties of Metallic Soap and Application thereof"), published by Miyuki Shobo, *Insatu Ink Gijutu* (which means "*Techniques for Printing Ink*"), published by CMC Shuppan in 1984, and *Saishin Ganryo Ohyo Gijutu* (which means "*Newest Application Arts of Pigments*"), published by CMC Shuppan in 1986. Of these pigments, the pigments capable of absorbing infrared or near infrared rays are preferred in particular because the printing plate precursor containing them can have suitability for irradiation with laser devices emitting infrared or near infrared rays.

As the pigments absorbing infrared or near infrared rays, carbon black, hydrophilic resin-coated carbon black and silica sol-modified carbon black are used to advantage. Of these pigments, the carbon black which has undergone surface treatment with hydrophilic resin or silica sol is especially useful because it has good compatibility or dispersibility with water-soluble resins and no adverse effect on hydrophilic properties.

For the grain size of pigment, it is desirable to be in the range of 0.01 to 1 $\mu$m, preferably 0.01 to 0.5 $\mu$m. In dispersing pigment grains, conventional dispersing techniques used for ink production or toner production can be adopted. Examples of a dispersing machine usable therein include an ultrasonic disperser, a sand mill, an attriter, a pearl mill, a super mill, a ball mill, an impeller, a disperser, a KD mill, a colloid mill, a Dynatron, a three-rod roll mill and a pressure kneader. Details thereof are described in *Saishin Ganryo Ohyo Gijutu* (which means "*Newest Application Arts of Pigments*"), published by CMC Shuppan in 1986.

As to the dyes, on the other hand, commercially available dyes and dyes known in literature (e.g., *Senryo Binran* (which means "*Handbook of Dyes*"), compiled by Yuki Gousei Kagaku Kyokai, published in 1970) can be utilized. Examples thereof include azo dyes, metal complex azo dyes, pyrazolone azo dyes, anthraquinone dyes, phthalocyanine dyes, carbonium dyes, quinoneimine dyes, methine dyes and cyanine dyes. Of these dyes, the dyes capable of absorbing infrared or near infrared rays are preferred in particular because the printing plate precursor containing them can have suitability for irradiation with laser devices emitting infrared or near infrared rays.

More specifically, the infrared or near infrared absorbing dyes usable in the invention include the cyanine dyes disclosed in, e.g., JP-A-58-125246, JP-A-59-84356, JP-A-59-202829 and JP-A-60-78787, the methine dyes disclosed in, e.g., JP-A-58-173696, JP-A-58-181690 and JP-A-58-194595, the naphthoquinone dyes disclosed in, e.g., JP-A-58-112793, JP-A-58-224793, JP-A-59-48187, JP-A-59-73996, JP-A-60-52940 and JP-A-60-63744, the squarylium dyes disclosed in, e.g., JP-A-58-112792, the cyanine dyes disclosed in British Patent 434,875, and the dyes disclosed in U.S. Pat. No. 4,756,993 as those represented by the following formulae (I) and (II):

(I)

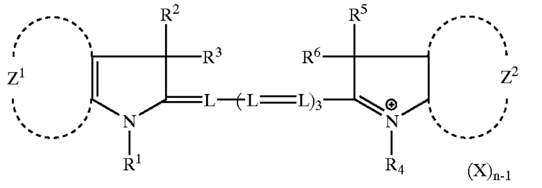

wherein $R^1$, $R^2$, $R^3$, $R^4$, $R^5$ and $R^6$ are each a substituted or unsubstituted alkyl group; $Z^1$ and $Z^9$ are each atoms completing a substituted or unsubstituted benzene or naphthalene ring (i.e., phenyl or naphthalene group); L is a substituted or unsubstituted methine group, and the substituent on each methine group may be an alkyl group containing not more than 8 carbon atoms, a halogen atom or an amino group, or the substituents on different two methine groups may be combined to complete a substituted or unsubstituted cyclohexene or cyclopentene ring, wherein the substituent on the ring may be an alkyl group containing not more than 6 carbon atom or a halogen atom; X is an anionic group; n is 1 or 2; and besides, at least one of R1, R2, R3, R4, R5, R6, Z1 and Z2 has a substitutent containing an acid moiety or an alkali metal or amine salt thereof.

(II)

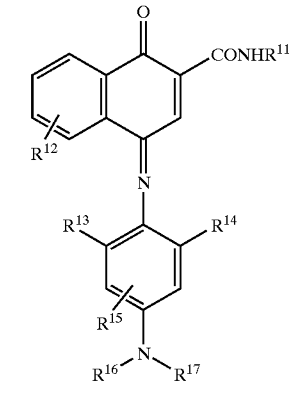

wherein $R^{11}$ is a substituted or unsubstituted alkyl group, a substituted or unsubstituted aryl group, or a substituted or unsubstituted heterocyclic group; $R^{12}$ and $R^{15}$ are each a hydrogen atom or a group capable of being substituted for a hydrogen atom; $R^{13}$ and $R^{14}$ are each a hydrogen atom, a halogen atom, a substituted or unsubstituted alkoxy group, or a substituted or unsubstituted alkyl group, but the case of $R^{13}$=$R^{14}$=H is excluded; and $R^{16}$ and $R^{17}$ are each a substituted or unsubstituted alkyl group, a substituted or unsubstituted aryl group, an acyl group or a sulfonyl group, or $R^{16}$ and $R^{17}$ are combined with each other to complete a nonmetal 5-membered or 6-membered ring.

Further, the near infrared absorption sensitizers disclosed in U.S. Pat. No. 5,156,938 can also be used to advantage. In addition, the substituted arylbenzo(thio)-pyrylium salts disclosed in U.S. Pat. No. 3,881,924, the trimethinethiapyrylium salts disclosed in JP-A-57-142645 (U.S. Pat. No. 4,327,169), the pyrylium compounds disclosed in JP-A-58-181051, JP-A-58-220143, JP-A-59-41363, JP-A-59-84248, JP-A-59-84249, JP-A-59-146063 and JP-A-59-146061, the cyanine dyes disclosed in JP-A-59-216146, the pentamethinethiopyrylium salts disclosed in U.S. Pat. No. 4,283,475, the pyrylium compounds disclosed in JP-B-5-13514 and JP-B-5-19702, and Epolight III-178, Epolight III-130 and Epolight III-125 (trade names, products of Epolin Co., Ltd.) can be used to particular advantage.

Of those dyes, the water-soluble cyanine dyes of the foregoing formula (I) are preferred in particular.

Examples of such cyanine dyes are illustrated below:

(I-1)

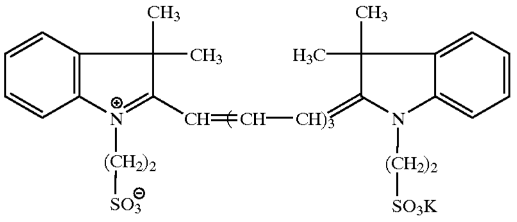

(I-2)

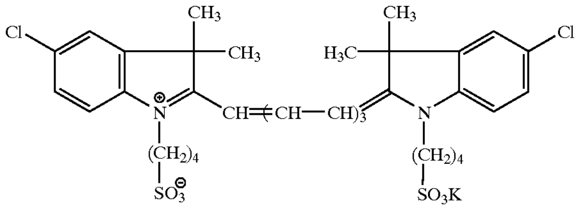

(I-3)

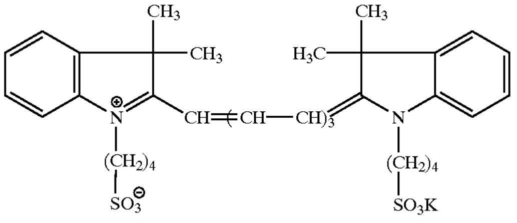

(I-4)

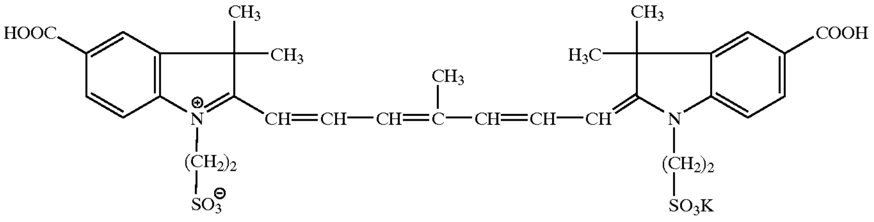

(I-5)

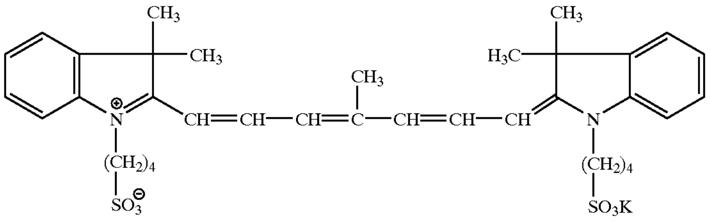

(I-6)

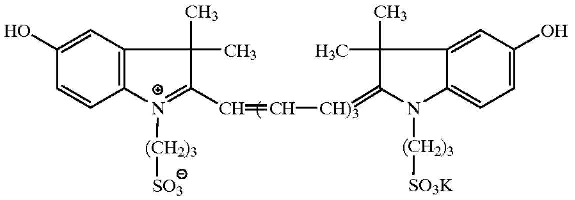

(I-7)

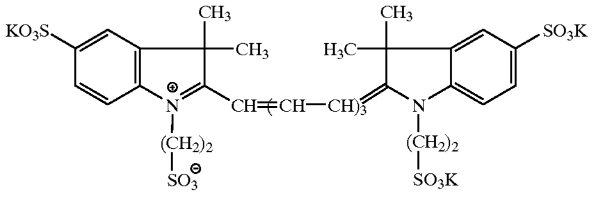

(I-8)

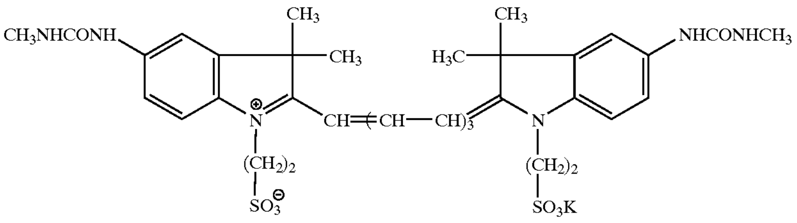

-continued
(I-9)
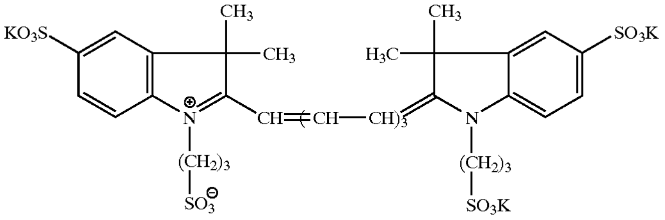
(I-10)
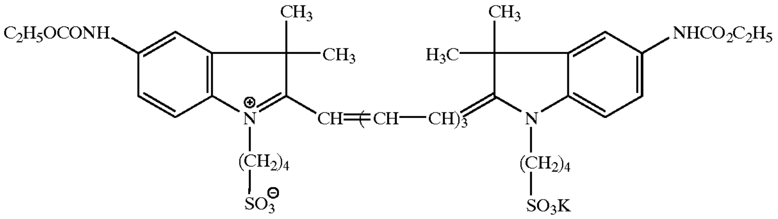
(I-11)
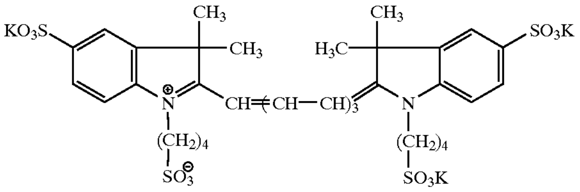
(I-12)
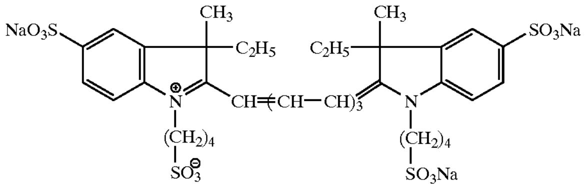
(I-13)
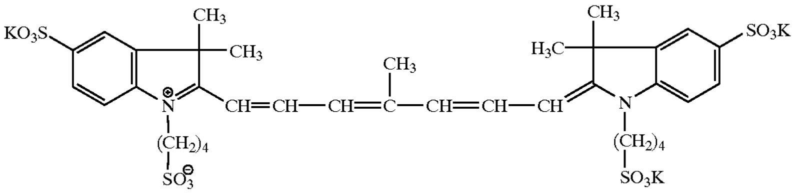
(I-14)
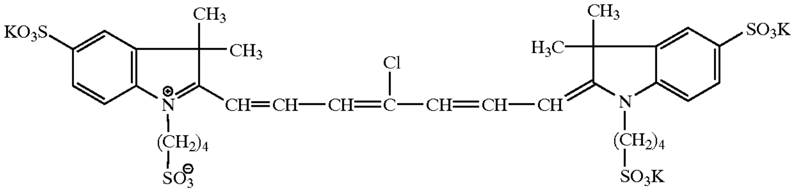
(I-15)
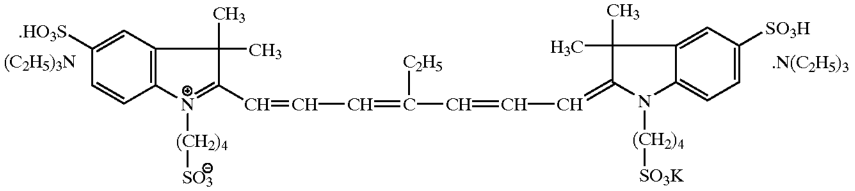
(I-16)
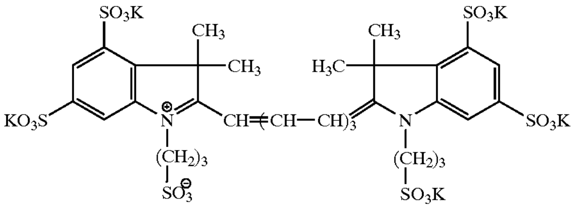
(I-17)
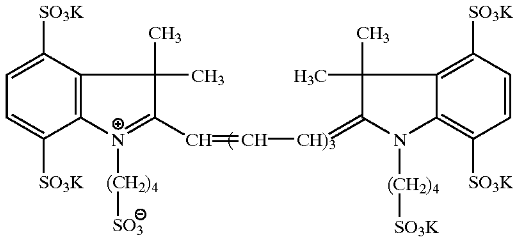

-continued
(I-18)
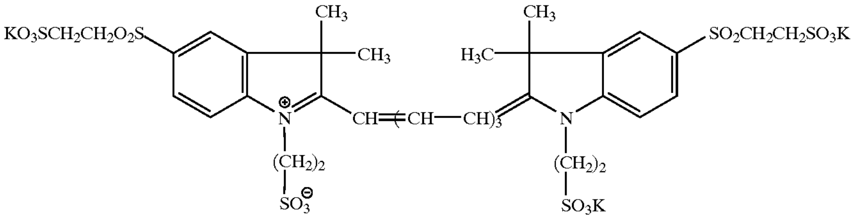
(I-19)
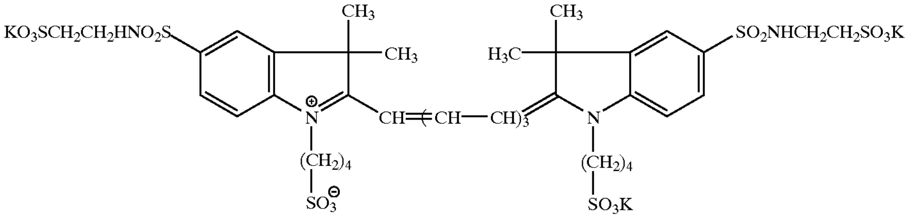
(I-20)
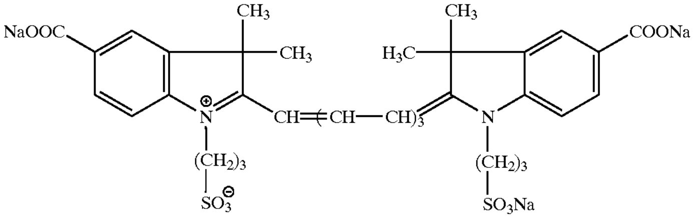
(I-21)
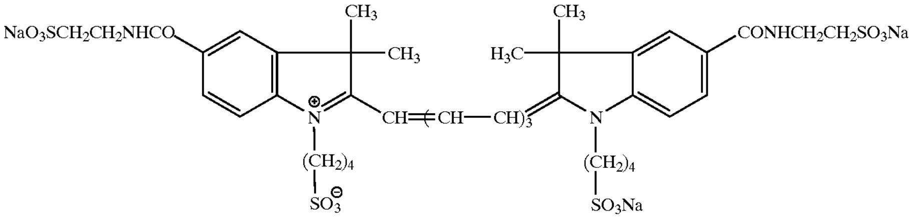
(I-22)
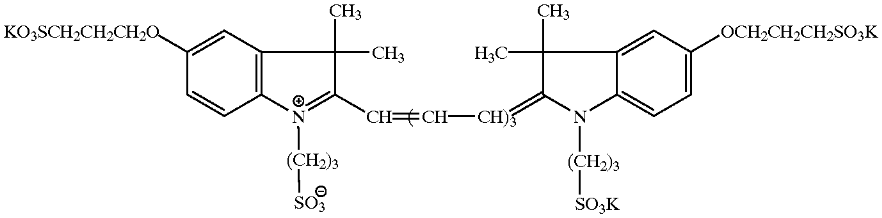
(I-23)
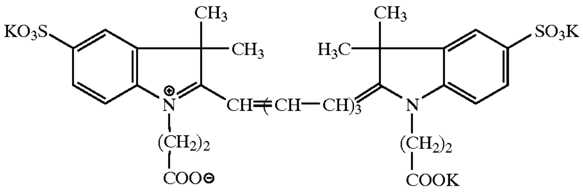
(I-24)
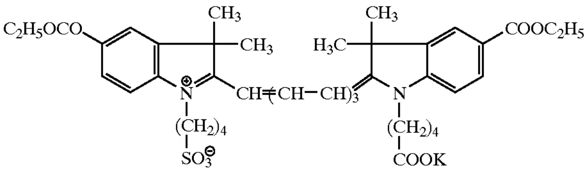
(I-25)
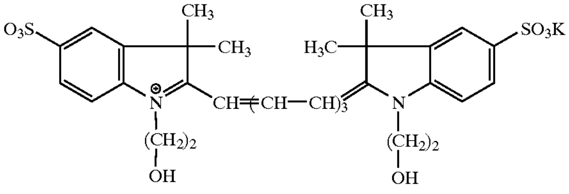
(I-26)
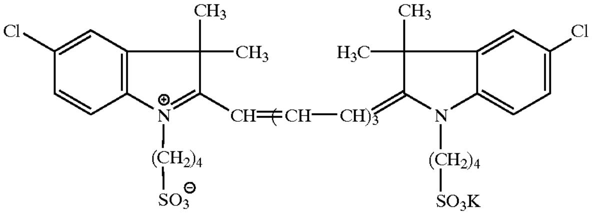

-continued
(I-27)
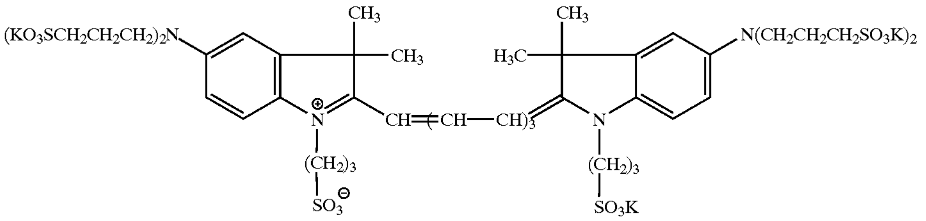
(I-28)
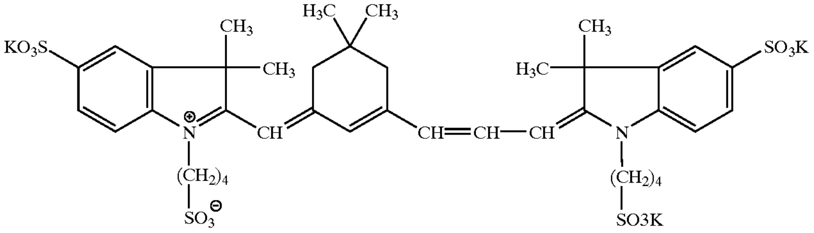
(I-29)
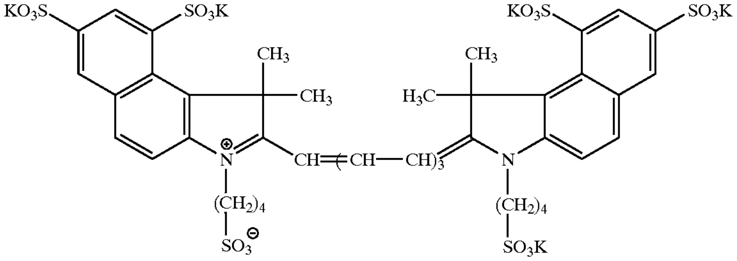
(I-30)
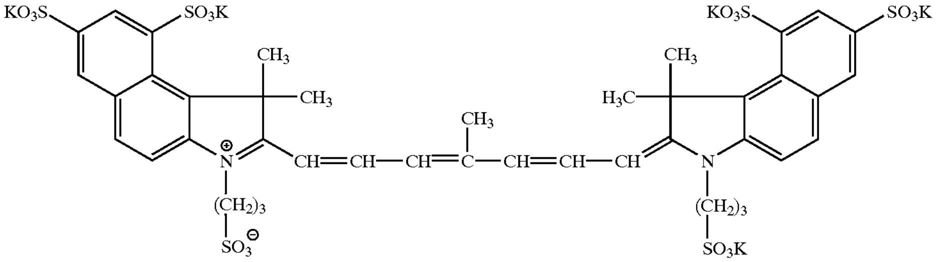
(I-31)
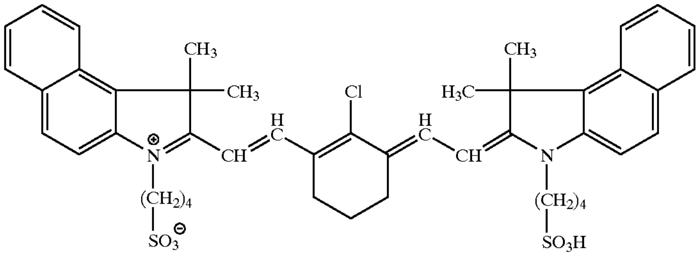
(I-32)
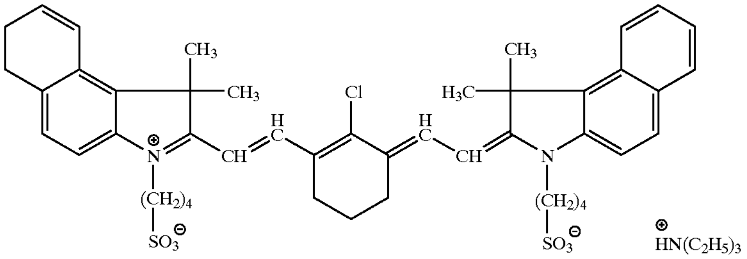
Those dyes and pigments are incorporated in a proportion of 1 to 70 weight %, preferably 2 to 50 weight %, and in the case of the dyes, more preferably 2 to 50 weight %, particularly preferably 2 to 30 weight %, and in the case of the pigments, particularly preferably 2 to 50 weight %, to the total solids in the composition for forming the overcoat layer. When the proportion of dye(s) or pigment(s) added is below the foregoing range, the sensitivity becomes low; while, when it is above the foregoing range, the uniformity of the layer is lost, and the durability of the layer is lowered.

When the overcoat layer is formed by coating an aqueous composition, the surfactants most of which is a nonionic surfactant may be added to the aqueous composition for the purpose of securing uniformity for the coating Examples of a nonionic surfactant usable for such a purpose include sorbitan tristearate, sorbitan monopalmitate, sorbitan trioleate, stearic acid monoglyceride, polyoxyethylene nonyl phenyl ether and polyoxyethylene dodecyl ether.

The suitable proportion of the nonionic surfactant to the total solids in the overcoat layer is from 0.05 to 5 weight %, preferably from 1 to 3 weight %.

The suitable thickness of the overcoat layer used in the invention is from 0.05 $\mu$m to 4.0 $\mu$m, preferably from 0.1 $\mu$m to 1.0 $\mu$m. When the overcoat layer is too thick, the time spent in removing it by a printing operation becomes too long and the water-soluble resin eluted in quantity influences the fountain solution to cause printing troubles, such as roller stripping and no inking in the image area. On the other hand, when the overcoat layer is too thin, it tends to have poor film quality.

The present hydrophilic layer having a three-dimensionally cross-linked structure is a layer insoluble in a fountain solution used for a lithographic process using water and/or ink, and it is desirable for the hydrophilic layer to comprise a colloid as described below. Specifically, the colloid contains as a constituent the sol/gel conversion system of an oxide or hydroxide of beryllium, magnesium, aluminum, silicon, titanium, boron, germanium, tin, zirconium, iron, vanadium, antimony or a transition metal. In some cases, the colloid may be a colloid comprising a complex of two or more of the above-described chemical elements. In the colloid, the atoms of such a chemical element as described above form a network structure via oxygen atoms, and at the same time they have unbonded hydroxyl and alkoxy groups also. While a good deal of active alkoxy and hydroxyl groups are present in the colloid at the initial stage of hydrolytic condensation, the colloid particles increase their sizes and become inactive as the reaction proceeds. The colloid particles are generally from 2 nm to 500 nm in diameter. In a case of silica, the spherical colloid particles having a diameter of from 5 nm to 100 nm are suitable for use in the invention. In addition, the colloid particles having a shape of feather of 100 nm×10 nm in size, as in an aluminum colloid, are also effective for use in the invention.

Further, the colloid particles having a shape of pearl necklace, which is from 50 nm to 400 nm in length and made up of spherical particles having a diameter from 10 nm to 50 nm, can be used in the invention.

While the colloid as mentioned above may be used alone, they can be used as a mixture with hydrophilic resin. In order to promote the cross-linking reaction, the cross-linking agent for colloid may be added.

In general cases, the colloid contains a stabilizer. As the stabilizer, the compound having an anionic group is added to positively charged colloids, while the compound having a cationic group is added to negatively charged colloids. For instance, the stabilizers added to negatively charged silicon colloids are amine compounds, and those added to positively charged aluminum colloids are strong acids, such as hydrochloric acid and acetic acid. Most of these colloids form transparent films at room temperature when applied to substrates. However, the complete gelling of the colloid coating cannot be achieved only by evaporation of the colloid solvent. So the colloid coating is heated up to the temperature enabling the removal of the stabilizer to form a tightly cross-linked three-dimensional structure, and thereby becomes a hydrophilic layer suitable for the invention.

In another feasible way, a proper sol state is created directly from a starting material (e.g., di-, tri- and/or tetraalkoxysilane) by hydrolytic condensation reaction without using the stabilizer as mentioned above. And the sol produced therein is coated on a substrate as it is, and then dried to complete the reaction. In this case, the three-dimensional cross-linking can be achieved at a lower temperature than in the cases of using stabilizers.

In addition, the colloids prepared by dispersing appropriate hydrolytic condensation products in organic solvents to stabilize them are also suitable for the invention. Merely by evaporating the solvents from such colloids, three-dimensionally cross-linked films are formed. And the drying at room temperature becomes possible by selecting a low boiling point solvent, such as methanol, ethanol, propanol, butanol, ethylene glycol monomethyl ether, ethylene glycol monoethyl ether or methyl ethyl ketone. In particular, the colloid in methanol or ethanol solvent can be easily cured at a low temperature, and so useful in the invention.

As hydrophilic resins used together with the colloids as described above, the resins having hydrophilic groups, such as hydroxyl, carboxyl, hydroxyethyl, hydroxypropyl, amino, aminoethyl, aminopropyl and carboxylmethyl groups, are preferred.

Examples of such hydrophilic resins include gum arabic, casein, gelatin, starch derivatives, carboxymethyl cellulose and sodium salts thereof, cellulose acetate, sodium alginate, vinyl acetate-maleic acid copolymers, styrene-maleic acid copolymers, polyacrylic acids and salts thereof, polymethacrylic acids and salts thereof, hydroxyethyl methacrylate homopolymer and copolymers, hydroxyethyl acrylate homopolymer and copolymers, hydroxypropyl methacrylate homopolymer and copolymers, hydroxypropyl acrylate homopolymer and copolymers, hydroxybutyl methacrylate homopolymer and copolymers, hydroxybutyl acrylate homopolymer and copolymers, polyethylene glycols, hydroxypropylene polymers, polyvinyl alcohol and hydrolyzed polyvinyl acetates having hydrolysis degree of at least 60 weight %, preferably at least 80 weight %, polyvinyl formal, polyvinyl butyral, polyvinylpyrrolidone, acrylamide homopolymer and copolymers, methacrylamide homopolymer and copolymers, and N-methylolacrylamide homopolymer and copolymers.

Of these hydrophilic resins, the polymers containing hydroxyl groups but having no solubility in water, such as hydroxyethyl methacrylate homopolymer and copolymers and hydroxyethyl acrylate copolymers, are preferred in particular.

In the combined use of the hydrophilic resin as described above and the colloid, the appropriate proportion of the water-soluble hydrophilic resin is 40 weight % or less to the total solids in the hydrophilic layer, while that of the water-insoluble hydrophilic resin is 20 weight % or less to the total solids in the hydrophilic layer.

These hydrophilic resins can be used as they are, but for purpose of increasing the impression capacity of the resultant printing plate, the cross-linking agents for the hydrophilic resin which are not colloids may be used. Examples of a cross-linking agent for hydrophilic resins include formaldehyde, glyoxal, initial hydrolytic condensation products of polyisocyanate and tetraalkoxysilanes, dimethylolurea and hexamethylolmelamine.

Besides the colloid of the oxide or the hydroxide as described above and the hydrophilic resins as described above, a cross-linking agent for promoting the cross-linking of the colloid may be added to the present hydrophilic layer. Suitable examples of such a cross-linking agent include an initial hydrolytic condensation product of tetraalkoxysilane, trialkoxysilylpropyl-N,N,N-trialkylammonium halide and aminopropyltrialkoxysilane. The appropriate proportion of such a cross-linking agent is 5 weight % or less to the total solids in the hydrophilic layer.

To the present hydrophilic layer, the hydrophilic light-heat converting agent added to the overcoat layer mentioned above may further be added for the purpose of increasing the thermal sensitivity. Especially desirable light-heat converting agents are water-soluble infrared absorbing dyes, specifically cyanine dyes represented by the foregoing formula (I) and containing sulfonic acid groups or alkali metal or amine salts of sulfonic acid groups. The appropriate proportion of pigment or dye added as light-heat converting agent is from 1 to 70 weight %, preferably from 2 to 50 weight %, and in the case of the dye, more preferably from 2 to 50 weight %, particularly preferably from 2 to 30 weight %, and in the case of the pigment, particularly preferably from 2 to 50 weight %, to the total solids in the hydrophilic layer. In the invention, when the light-heat converting agent is added to the overcoat layer, if necessary, the light-heat converting agent may be added to the hydrophilic layer, and the amount of the light-heat converting agent can be made smaller than usual. When the amount added is below the foregoing range, the sensitivity becomes low, while, when it is above the foregoing range, the hydrophilic properties of the hydrophilic layer are spoiled and the uniformity and durability thereof is lowered.

The suitable thickness of a coating for the present three-dimensionally cross-linked hydrophilic layer is from 0.1 $\mu$m to 3 $\mu$m, preferably from 0.5 $\mu$m to 2 $\mu$m. When the coating is too thin, the durability of the hydrophilic layer becomes poor and the resultant printing plate has inferior impression capacity. On the other hand, when the coating is too thick, great energy is required for ablation-like release of the hydrophilic layer from an ink receptive layer as the lower layer. In other words, a long drawing time becomes necessary when laser is used for exposure, thereby lowering the productivity in making the printing plate. In a case of drawing with a commercially available semiconductor laser of general type, the energy of 300 to 400 mJ/cm$^2$ is required when the thickness is about 0.5 $\mu$m, and the energy of 400 to 500 mJ/cm$^2$ is required when the thickness is about 1.5 $\mu$m.

As the present substrate having an ink-receptive surface or coated with an ink-receptive layer can be used a dimensionally stable sheet-form material. Suitable examples of such a material include paper, paper laminated with oleophilic plastic (e.g., polyethylene, polypropylene, polystyrene), a metal sheet (e.g., a sheet of aluminum, zinc, copper, nickel or stainless steel), a sheet of the metal as described above which is coated with an ink-receptive organic high molecular resin, a plastic film (e.g., a film of cellulose diacetate, cellulose triacetate, cellulose propionate, cellulose butyrrate, cellulose acetate butyrate, cellulose nitrate, polyethylene terephthalate, polyethylene, polystyrene, polypropylene, polycarbonate or polyvinyl acetal), a film of the plastic as described above which is coated with an ink-receptive organic high molecular resin, and paper or a plastic film on which the ink-receptive metal as described above is laminated or vapor-deposited.

Of these materials, the substrates preferably used are a polyethylene terephthalate film, a polycarbonate film, an aluminum or stainless steel sheet coated with an ink-receptive organic high molecular resin, and an aluminum or stainless steel sheet laminated with an oleophilic plastic film.

The aluminum sheet suitably used in the invention is a pure aluminum sheet or an aluminum alloy sheet containing trace amounts of foreign metals, on the surface of which an ink-receptive high molecular compound is coated or an ink-receptive plastic film is laminated. As examples of foreign metals contained in the aluminum alloy, silicon, iron, manganese, copper, magnesium, chromium, zinc, bismuth, nickel and titanium are exemplified. The content of those foreign metals in the alloy is 10 weight % or less. In the invention, however, the aluminum sheet properly selected from hitherto known and widely used aluminum sheets may be utilized.

In using an aluminum sheet for the present substrate, it is desirable that the sheet surface be subjected to graining treatment. When the aluminum sheet is coated with an organic high polymer-containing ink-receptive layer, the graining treatment can easily ensure for the sheet surface the adhesion to the ink-receptive layer. Before the aluminum sheet surface is roughened by the graining treatment, the degreasing treatment with a surfactant, an organic solvent or an alkaline aqueous solution is carried out to remove the rolling oil from the sheet surface.

The graining of the aluminum sheet surface can be effected using various methods, such as a mechanical graining method, a method of graining the sheet surface by electrochemical dissolution, and a method of dissolving selectively the sheet surface by a chemical means. As to the mechanical graining method, known methods, such as a ball abrasion method, a brush abrasion method, a blast abrasion method and a buff abrasion method, can be adopted. As the chemical graining method, the method as disclosed in JP-A-54-31187, wherein the aluminun sheet is immersed in a saturated water solution of aluminum salt of mineral acid, is used to advantage. As the electrochemical graining method, the method of graining by application of AC or DC to an electrolyte containing an acid, such as hydrochloric acid or nitric acid, is favorably adopted. In addition, electrolytic graining method using a mixed acid as disclosed in JP-A-54-63902 can be utilized.

The graining treatment according to any of the above-cited methods is desirably performed so that the aluminum sheet surface has a center line average surface roughness (Ra) in the range of 0.3 to 1.0 $\mu$m.

The grained aluminum sheet is subjected to an alkali etching treatment with a water solution containing, e.g., potassium hydroxide or sodium hydroxide, and further to neutralization treatment, if needed, and then to anodic oxidation treatment, if desired, for an increase in abrasion resistance.

For the anodic oxidation treatment of an aluminum sheet, various electrolytes capable of forming a porous oxidized film can be employed. In general, sulfuric acid, hydrochloric acid, oxalic acid, chromic acid and a mixture of two or more thereof can be used as such an electrolyte. The suitable electrolyte concentration can be chosen depending on the species of the electrolyte used.

The conditions for anodic oxidation treatment change variously depending on the electrolyte used, so they cannot be generalized. However, according to normal standards of anodic oxidation, the appropriate electrolyte concentration is from 1 to 80 weight %, the electrolyte solution temperature is from5 to 70° C., the current density is from 5 to 60 ampere/dm$^2$, the voltage is from 1 to 100 V and the electrolysis time is from 10 seconds to 5 minutes.

The suitable amount of oxidized coat formed is from 1.0 to 5.0 g/$m^2$, particularly from 1.5 to 4.0 g/$m^2$.

The thickness of the substrate used in the invention is of the order of 0.05–0.6 mm, preferably from 0.1 mm to 0.4 mm, particularly preferably from 0.15 mm to 0.3 mm.

The organic polymers which can be coated as an ink-receptive layer on the present substrate surface are polymers soluble in solvents and capable of forming oleophilic films. Further, such polymers are preferably insoluble in the solvent used in a coating composition for forming a hydrophilic layer as the upper layer. In some cases, however, the polymers capable of swelling in the solvent used for coating the upper layer are advantageous because they have excellent adhesiveness to the upper layer. In the other case of using organic polymers soluble in the solvent used for coating the upper layer, it is desirable that the polymer layer be in advance cured by, e.g., addition of a cross-linking agent.

Examples of a useful organic polymer include polyester, polyurethane, polyurea, polyimide, polysiloxane, polycarbonate, phenoxy resin, epoxy resin, phenol-formaldehyde resin, alkylphenol-formaldehyde resin, polyvinyl acetate, acrylic resin and acrylic copolymers, polyvinyl phenol, polyvinyl-halogenated phenol methacrylic resin and methacrylic copolymers, acrylamide copolymers, methacrylamide copolymers, polyvinyl formal, polyamide, polyvinyl butyral, polystyrene, cellulose ester resin. polyvinyl chloride and polyvinylidene chloride. Of these polymers, resins containing in their side chains hydroxyl groups, carboxyl groups, sulfonamido groups or trialkoxysilyl groups are preferred over the others because they have high adhesiveness to both substrate and hydrophilic layer as the upper layer and, in some cases, they are easily cured by cross-linking agents. In addition, acrylonitrile copolymers, polyurethane and copolymers containing sulfonamido or hydroxyl groups in their side chains which are photocured by diazo resin are used favorably.

Besides the polymers described above, novolak resins and cresol resins prepared by condensation reaction between formaldehyde and phenolic compounds, such as phenol, cresol (m-cresol, p-cresol or a m-cresol/p-cresol mixture), a phenol/cresol mixture (a phenol/m-cresol, phenol/p-cresol or phenol/m-cresol/p-cresol mixture), phenol-modified xylene, tert-butylphenol, octylphenol, resorcinol, pyrogallol, catechol, chlorophenol (m-chlorophenol or p-chlorophenol), bromophenol (m-bromophenol or p-bromophenol), salicylic acid and phloroglucinol, and resins prepared by condensation of acetone and the phenolic compounds as described above are also useful.

As examples of other suitable high molecular compounds, copolymers containing constitutional units derived from some monomers selected from the following families (1) to (12) and having their molecular weight in the range of $1\times10^4$ to $2.0\times10^5$ are exemplified:

(1) Aromatic hydroxyl group-containing acrylamides. methacrylamides, acrylic acid esters and methacrylic acid esters, and hydroxystyrenes, such as N-(4-hydroxyphenyl)acrylamide, N-(4-hydroxyphenyl)-methacrylamide, o-, m- and p-hydroxystyrenes, o-, m- and p-hydroxyphenlylacrylates, and o-, m- and p-hydroxyphenyl-methacrylates;

(2) Aliphatic hydroxyl group-containing acrylic acid esters and methacrylic acid esters, such as 2-hydroxyethyl acrylate and 2-hydroxyethyl methacrylate;

(3) Unsubstituted or substituted acrylic acid esters, such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate.

(4) Unsubstituted or substituted methacrylic acid esters, such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N-dimethylaminoethyl methacrylate;

(5) Acrylamides and methacrylamides, such as acrylamide, methacrylamide. N-methylolacrylamide, N-methylolmethacryl-amide, N-ethylacrylamide, N-ethylmethacrylamide, N-hexylacrylamide, N-hexylmethacrylamide, N-cyclohexylacryl-amide, N-cyclohexylmethacrylamide, N-hydroxyethylacrylamide, N-hydroxyethylmethacrylamide, N-phenylacrylamide, N-phenylmethacrylamide, N-benzylacrylamide, N-benzyl-methacrylamide, N -nitrophenylacrylamide, N-nitrophenyl -methacrylamide, N-ethyl-N -phenylacrylamide and N-ethyl-N-phenylmethacrylamide;

(6) Vinyl ethers, such as ethyl vinyl ether, 2-chloroethyl vinyl ether, hydroxyethyl vinyl ether, propyl vinyl ether, butyl vinyl ether, octyl vinyl ether and phenyl vinyl ether;

(7) Vinyl esters, such as vinyl acetate, vinyl chloroacetate, vinyl butyrate and vinyl benzoate;

(8) Styrenes, such as styrene, methylstyrene and chloromethylstyrene;

(9) Vinyl ketones, such as methyl vinyl ketone, ethyl vinyl ketone, propyl vinyl ketone and phenyl vinyl ketone;

(10) Olefins, such as ethylene, propylene, isobutylene, butadiene and isoprene;

(11) N-vinylpyrrolidone, N-vinylcarbazole, 4-vinylpyridine, acrylonitrile and methacrylonitrile; and

(12) Acrylamides such as N-(o-aminosulfonylphenyl) acrylamide, N-(m-aminosulfonylphenyl)acrylamide, N-(p-aminosulfonyl-phenyl)acrylamide, N-[1-(3-aminosulfonyl)naphthyl]acryl-amide and N-(2-aminosulfonylethyl)acrylamide, methacryl-amides such as N-(o-aminosulfonylphenyl)methacrylamide, N-(m-aminosulfonylphenyl)methacrylamide, N-(p-aminosulfonyl-phenyl)methacrylamide, N-[1-(3-aminosulfonyl)naphthyl]-methacrylamide and N-(2-aminosulfonylethyl)methacrylamide, unsaturated sulfonamides of acrylates such as o-aminosulfonylphenyl acrylate, m-aminosulfonylphenyl acrylate, p-aminosulfonylphenyl acrylate and 1-(3-aminosulfonyl-phenylnaphthyl)acrylate, and unsaturated sulfonamides of methacrylates such as o-aminosulfonylphenyl methacrylate, m-aminosulfonylphenyl methacrylate, p-aminosulfonylphenyl methacrylate and 1-(3-aminosulfonylphenylnaphthyl)-methacrylate.

The organic polymer as described above is dissolved in an appropriate solvent, coated on the substrate and then dried, thereby providing an ink-receptive layer on the substrate. Therein, the organic polymer, though it alone may be dissolved in the solvent, is generally used together with a cross-linking agent, an adhesion aid, a color-producing agent, inorganic or organic fine particles, a coating surface improver or a plasticizer. To the ink-receptive layer may further be added a light-heat converting agent for increasing the sensitivity and a thermally color-producing or color-extinguishing system for forming print-out image after exposure.

Examples of a cross-linking agent for organic polymers include diazo resin, aromatic azide compounds, epoxy resin, isocyanate compounds, block isocyanate compounds, initial hydrolytic condensation products of tetraalkoxysilanes, glyoxal, aldehyde compounds and methylol compounds.

As to the adhesion aid usable in the ink-receptive layer, the diazo resin is favorable because of its excellent adhesiveness to both substrate and ink-receptive layer. In addition, silane coupling agents, isocyanate compounds and coupling agents of titanium type are also useful.

As the color-producing agent, general dyes and pigments can be used. Specifically, examples of the suitable dyes include Rhodamine 6G chloride, Rhodamine B chloride, Crystal Violet, Malachite Green oxalate, oxazine-4-perchlorate, quinizarin, 2-(α-naphthyl)-5-phenyl-oxazole and coumarin-4; while examples of the suitable pigments include triphenylmethane dyes, diphenylmethane dyes, oxazine dyes, xanthene dyes, iminonaphthoquinone dyes, azomethine dyes and anthraquinone dyes, which are represented by Oil Yellow #101, Oil Yellow #103, Oil Pink #312, Oil Green BG, Oil Blue BOS, Oil Blue #603, Oil Black BY, Oil Black BS, Oil Black T-505 (all the items described above are products of Orient Kagaku Kogyo K.K.), Victoria Pure Blue, Crystal Violet (CI42555), Methyl Violet (CI42535), Ethyl Violet, Methylene Blue (CI52015), Patent Pure Blue (produced by Sumitomo Mikuni Kagaku K.K.), Brilliant Blue, Methyl Green, Erythricin B, Basic Fuchsine, m-cresol purple, Auramine, 4-p-diethylaminophenyliminonaphthoquinone and cyano-p-diethylaminophenylacetanilide. In addition, the dyes disclosed in JP-A-62-293247 and JP-A-9-179290 are also used to advantage.

When the color-producing materials as described above are added to the ink-receptive layer, their proportion to the total solid components in the receptive layer is generally from about 0.02 to about 10 weight %, preferably from about 0.1 to about 5 weight %.

Further, the fluorine-containing surfactants and silicone surfactants well-known as a coating surface improver can be used. More specifically, the surfactants containing perfluoroalkyl groups or dimethylsiloxane groups are useful because they can rectify the coating surface condition.

The inorganic or organic fine powders usable in the invention include colloidal silica and colloidal aluminum having particle size of from 10 nm to 100 nm, and further inactive particles having larger diameter than colloids, such as silica particles, silica particles having the surfaces rendered hydrophobic, alumina particles, titanium dioxide particles, other heavy metal particles, clay and talc. The addition of these inorganic or organic fine powders to the ink-receptive layer can improve the adhesiveness to the three-dimensionally cross-linked hydrophilic layer as the upper layer, thereby increasing impression capacity of the resultant printing plate. The suitable proportion of these fine powders in the ink-receptive layer is 80 weight % or less, preferably 40 weight % or less, to the total solid components.

The present ink-receptive layer can further contain a plasticizer for imparting flexibility to the coated film, if desired. Examples of a plasticizer usable for such a purpose include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and acrylic or methacrylic acid oligomers or polymers.

For the purpose of discriminating between image and non-image areas upon exposure, it is favorable to add a color-producing or color-extinguishing system to the present ink-receptive layer. As examples of such a system, the combined uses of a thermally acid-generating agent, such as a diazo compound or diphenyl iodonium salt, and a leuco dye (such as leuco Malachite Green, leuco Crystal Violet or Crystal Vioilet lactone), and the combined use of a thermally acid-generating agent and a pH color-changeable dye (such as Ethyl Violet or Victoria Pure Blue BOH) are exemplified. In addition, the combination of acid color-developable dye and acidic binder, as disclosed in EP 897134, is also effective. In this case, the bond in the dye forming aggregate is broken by heating to produce the lactone body, thereby changing to colorless from colored.

The suitable proportion of color-producing or color-extinguishing system added is 10 weight % or less, preferably 5 weight % or less to the total solid components in the receptive layer.

For the purpose of increasing the thermal sensitivity, the present ink-receptive layer also may contain a light-heat converting agent. The light-heat converting agents suitable for this case, though they may be the infrared absorbing dyes and pigments as described above, are oleophilic dyes and pigments. In particular, carbon black and the oleophilic cyanine dyes selected from those represented by formula (I) are preferred over the others. Examples of such oleophilic cyanine dyes are illustrated below:

(I-33)

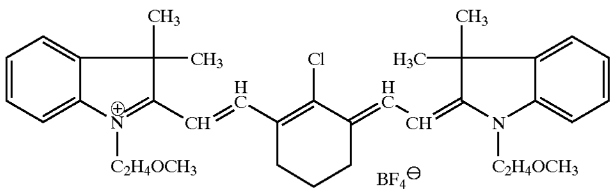

-continued (I-34)

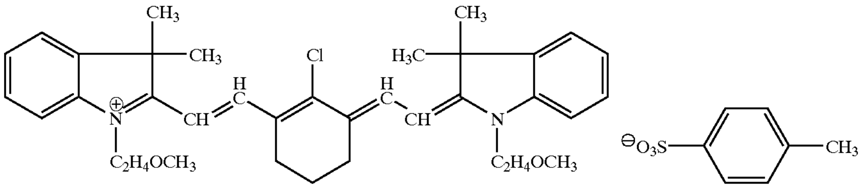

(I-35)

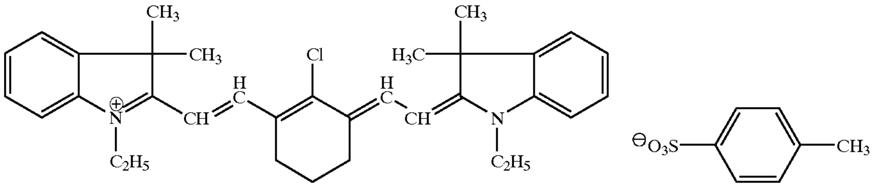

(I-36)

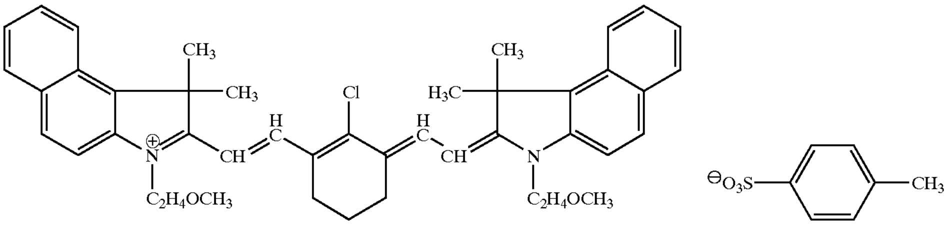

(I-37)

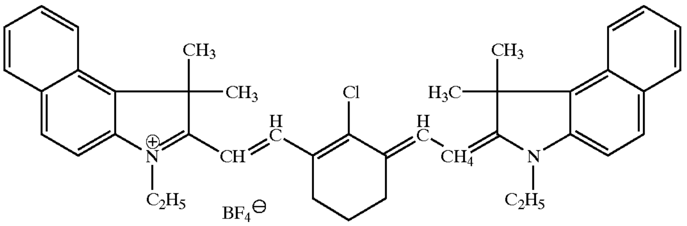

The suitable proportion of light-heat converting agent (namely dye or pigment) added is from 1 to 70 weight %, preferably from 2 to 50 weight %, and in the case of the dye, more preferably from 2 to 50 weight %, particularly preferably from 2 to 30 weight %, and in the case of the pigment, particularly preferably 2 to 50 weight %, to the total solid components in the ink-receptive layer.

When the proportion of dye or pigment added is higher than the foregoing upper limit, the layer comes to have poor uniformity and durability, and when the proportion is lower than the lower limit, the sensitivity is decreased.

Examples of a solvent usable for forming the present ink-receptive layer by coating include alcohols (such as methanol, ethanol, propyl alcohol, ethylene glycol, diethylene glycol, propylene glycol, dipropylene glycol, ethylene glycol monomethyl ether, propylene glycol monomethyl ether and ethylene glycol monoethyl ether), ethers (such as tetrahydrofuran, ethylene glycol dimethyl ether, propylene glycol dimethyl ether and tetrahydrofuran), ketones (such as acetone, methyl ethyl ketone and acetylacetone), esters (such as methyl acetate and ethylene glycol monomethyl monoacetate), amides (such as formamide, N-methylformamide, pyrrolidone and N-methylpyrrolidone), γ-butyrolactone, methyl lactate and ethyl lactate. These solvents may be used alone or as a mixture of two or more thereof. In preparing a coating solution for the ink-receptive layer, it is appropriate to adjust the concentration of the total components (the total solid contents including additives) in a solvent to the range of 1 to 50 weight %. The coating for forming the ink-receptive layer may be carried out using not only the organic solvent as described above but also an aqueous emulsion. In the latter case, it is appropriate for the emulsion to range in concentration from 5 to 50 weight %.

The thickness of the present ink-receptive layer after coating and drying is generally at least 0.1 μm, though it is not particularly restricted. In a case of providing the ink-receptive layer on a metal sheet, the appropriate layer thickness is at least 0.5 μm because the layer functions as a heat insulator also. When the ink-receptive layer is too thin, the heat evolved therein dissipates into the metal sheet; as a result, the sensitivity is decreased. In the case of a hydrophilic metal sheet, the abrasion resistance is required for the ink-receptive layer, and so the layer cannot secure impression capacity when it is too thin. In the case of using a plastic film as substrate, on the other hand, it is merely required for the ink-receptive layer to serve as an adhesive layer for the upper layer, and so the layer may have a thinner thickness than in the case of using a metal sheet, specifically a thickness of at least 0.05 μm.

Next the platemaking method using the aforementioned heat-sensitive lithographic printing plate precursor is illustrated below.

The lithographic printing plate precursor is subjected directly to imagewise heat-sensitive recording by means of, e.g., a thermal head, or undergoes light-heat conversion type exposure such as exposure to 700–1,200 nm infrared rays emitted from solid laser, semiconductor laser, high illumination intensity flashlight such as a xenon discharge lamp, or an infrared lamp.

In the exposure case, the images maybe drawn using either areal exposure or scanning method. The areal exposure method is a method of irradiating the printing plate precursor with infrared rays or high illumination intensity flashlight, such as a xenon discharge lamp, to generate heat by light-heat conversion. When an areal exposure light source such as an infrared lamp is used, the appropriate exposure, though it varies with the illumination intensity, is generally within the range of 0.1 to 10 J/cm$^2$, preferably 0.1 to 1 J/cm$^2$ in terms of the areal exposure intensity before modification with images for printing. When the substrate used is transparent, the exposure operation can also be carried out from the rear side of the substrate via the substrate. It is desirable to choose such illumination intensity that the foregoing exposure intensity can be achieved by the exposure time of from 0.01 to 1 msec, preferably 0.01 to 0.1 msec. When the irradiation time is long, it is required to increase the exposure intensity because the thermal energy production speed has a competitive relation to the diffusion speed of the thermal energy produced.

In the scanning exposure, the light source capable of generating infrared-rich laser beams is employed, and the images are drawn by scanning the printing plate precursor with the laser beams modulated by image information. Examples of a laser beam source usable therein include a semiconductor laser device, a He—Ne laser device, a He—Cd laser device and a YAG laser device. The suitable output of laser for the scanning exposure is from 0.1 to 300 W. When the exposure is carried out with a pulse laser device, however, it is effective that the device has the peak output of at least 1000 W, preferably 2000 W. The suitable exposure in these laser-scanning cases is from 0.1 to 10 J/cm$^2$, preferably 0.3 to 1 J/cm$^2$ in terms of the areal exposure intensity before modulation with images for printing.

After imagewise exposure, the present printing plate precursor can be loaded in a printing machine without undergoing any further processing Upon initiating the printing operations with ink and water, the overcoat layer is removed by the fountain solution, and at the same time the exposed area of the hydrophilic layer is also removed. As a result, the ink-receptive layer receives inking in the area bared by the removal of the hydrophilic layer to make it possible to enter into printing.

Now, the present invention will be illustrated in more detail by reference to the following examples. However, the invention should not be construed as being limited to these examples.

EXAMPLE I-1

Preparation of Aluminum Substrate

A 0.24 mm-thick rolled sheet of the JISA1050 aluminum material containing 99.5 weight % of aluminum, 0.01 weight % of copper, 0. 03 weight % of titanium, 0.3 weight % of iron and 0.1 weight % of silicon was subjected to surface graining treatment using a revolving nylon (6,10-nylon) brush and a 20 weight (aqueous suspension of 400-mesh purmice stone (produced by Kyoritsu Yogyo), and then washed thoroughly with water. This sheet was etched by immersion in a 15 weight % sodium hydroxide solution (containing 4.5 weight % aluminum) till the dissolved aluminum amount became 5 g/m$^2$, and then washed with running water. The thus etched sheet was neutralized with 1 weight % nitric acid, and then the electrolytic surface roughening treatment thereof was carried out in a 0.7 weight % aqueous solution of nitric acid (containing 0.5 weight % aluminum) by applying thereto the rectangular-wave alternating waveform voltage having 10.5 volt as anode voltage and 9.3 volt as cathode voltage (current ratio r=0.90, the current waveform disclosed in JP-B-58-5796) under a condition that the electricity at the anode was 160 coulomb/dm$^2$. After rinsing with water, the aluminum sheet was further etched by immersion in a 10 weight % aqueous sodium hydroxide solution kept at 35° C. till the dissolved aluminum amount became 1 g/m$^2$, followed by washing. Further, the sheet was desmutted by immersion in a 30 weight % aqueous sulfuric acid solution heated to 50° C., and then washed with water.

Furthermore, the thus treated aluminum sheet underwent an anodically oxidized porous film forming treatment using DC current in a 20 weight % aqueous solution of sulfuric acid kept at 35° C. (aluminum content: 0.8 weight %). More specifically, the electrolysis was carried out under the current density of 13 A/dm$^2$, and the electrolysis time was controlled so as to form an anodic oxidation film of 2.7 g/m$^2$.

The thus treated sheet was washed with water, dipped in a 0.2 weight % aqueous sodium silicate solution heated to 70° C. for 30 seconds, washed with water and then dried.

The aluminum substrate thus obtained had a reflection density of 0.30, measured with a Macbeth reflection densitometer RD920, and a center-line average surface roughness of 0.58 μm.

Synthesis of Organic Polymer for Ink-receptive Layer

In a 200 ml three-necked flask equipped with a stirrer, a condenser and a dropping funnel, 4.61 g (0.0192 mole) of N-(p-aminosulfonylphenyl)methacrylamide, 2.94 g (0.0258 mole) of ethyl methacrylate, 0.08 g (0.015 mole) of acrylonitrile and 20 g of N,N-dimethylacetamide were placed, and stirred while heating at 65° C. by means of a hot water bath. To this mixture, 0.15 g of a polymerization initiator V-65 (trade name, a product of Wako Pure Chemical Industries, Ltd.) was added, and stirred for 2 hours in a stream of nitrogen as the temperature was kept at 65° C. To the resulting reaction mixture, a mixture of 4.61 g of N-(p-aminosulfonylphenyl)methacrylamide, 2.94 g of ethyl methacrylate, 0.80 g of acrylonitrile, N,N-dimethylacetamide and 0.15 g of V-65 (a polymerization initiator produced by Wako Pure Chemical Industries, Ltd.) was further added dropwise from the dropping funnel over a 2-hour period. After the conclusion of dropwise addition, the mixture was further stirred for 2 hours at 65° C. At the conclusion of the reaction, 40 g of methanol was added, cooled, and poured into 2 liter of water with stirring. After stirring for additional 30 minutes, the reaction mixture was filtered off, and dried to yield 15 g of white solid. By gel permeation chromatography, it was confirmed that the thus produced N-(p-aminosulfonyl-phenyl)methacrylamide copolymer had a weight average molecular weight of 53,000 (by the polystyrene standard).

Preparation of Ink-receptive Substrate

A 3 g portion of the foregoing N-(p-aminosulfonylphenyl) methacrylamide copolymer was dissolved in a mixed solvent constituted of 9.5 g of γ-butyrolactone, 3 g of methyl lactate, 22.5 g of methyl ethyl ketone and 22 g of propylene glycol monomethyl ether, and coated on the foregoing aluminum substrate by means of a bar coater in a coating amount of 24 ml/m$^2$. Thereafter, the coating was dried by 1-minute heating at 100° C. Thus, the aluminum substrate provided with the ink-receptive layer having a dry coverage of about 1 g/m$^2$ was prepared.

Preparation of Heat-sensitive Lithographic Printing Plate Precursor

A mixture of 1 g of a 10% ethylene glycol monomethyl ether solution of 2-hydroxyethyl methacrylate homopolymer (weight average molecular weight: 250,000), 3 g of methanol silica (a colloid containing 30 weight % of 10–20 nm silica particles in methanol, produced by Nissan Chemicals Industries, Ltd.) and 16 g of methanol was coated on the foregoing ink-receptive layer provided on the substrate in a coating amount of 24 ml/m$^2$, and then dried at 100° C. for 1 minute. Thus, the three-dimensionally cross-linked hydrophilic layer having a dry coverage of about 1 g/m was formed on the ink-receptive layer.

On this hydrophilic layer, an aqueous solution constituted of 20 g of a 5% solution of acrylic acid homopolymer (weight average molecular weight: 25,000), 0.2 g of a water-soluble Cyanine Dye (I-31), which is illustrated hereinbefore, and 0.025 g of polyoxyethylene nonyl phenyl ether was coated in a coating amount of 12 ml/m$^2$, and then dried at 100° C. for 2 minutes, thereby forming an overcoat layer having a dry coverage of about 0.6 g/m$^2$ on the hydrophilic layer. Thus, a heat-sensitive lithographic printing plate precursor was prepared.

Preparation of Lithographic Printing Plate

The foregoing lithographic printing plate precursor was installed in a 40 W Trend Setter made by Canadian CREO Corp. (a plate setter equipped with a 40 W semiconductor laser emitting light of 830 nm), and thereto the laser energy of 300 mJ/cm$^2$ was applied. The printing plate precursor thus irradiated with laser was mounted in a Harris printing machine, and subjected to printing operations using an etch-containing 10 volume % aqueous solution of isopropyl alcohol as fountain solution in addition to ink. As a result, 10,000 sheets of scum-free, high-quality print were obtained.

EXAMPLE I-2

A heat-sensitive lithographic printing plate precursor was prepared in the same manner as in Example I-1, except that 3 g of the methanol silica was replaced by 4.5 g of a 20 weight % colloidal methanol solution of $ZrO_2.SiO_2$, Glassca 401 (trade name, a product of Nichiban Kenkyusho). Under the same conditions as in Example I-1, this plate precursor was exposed, mounted in the Harris printing machine, and then subjected to printing operations. As a result, 10,000 sheets of scum-free, high-quality print were obtained.

EXAMPLE I-3

A heat-sensitive lithographic printing plate precursor was prepared in the same manner as in Example I-1, except that the amount of methanol silica used was changed to 4.5 g from 3 g and the amount of 10% ethylene glycol monomethyl ether solution of 2-hydroxyethyl methacrylate homopolymer used was changed to 1.5 g from 1 g. The cross-linked hydrophilic layer of the thus prepared printing plate precursor had a dry coverage of about 1.5 g/m$^2$. This plate precursor was installed in a 40 W Trend Setter made by Canadian CREO Corp. (a plate setter equipped with a 40 W semiconductor laser emitting light of 830 nm), and thereto the laser energy of 450 mJ/cm$^2$ was applied. The printing plate precursor thus irradiated with laser was mounted in a Harris printing machine, and subjected to printing operations using an etch-containing 10 volume % aqueous solution of isopropyl alcohol as fountain solution in addition to ink. As a result, 25,000 sheets of scum-free, high-quality print were obtained.

EXAMPLE I-4

A heat-sensitive lithographic printing plate precursor was prepared in the same manner as in Example I-1, except that 1 g of the 10% ethylene glycol monomethyl ether solution of 2-hydroxyethyl methacrylate homopolymer was replaced by 1 g of a 10% ethylene glycol monomethyl ether solution of 2-hydroxyethyl methacrylate/methyl methacrylate (70/30 by weight %) copolymer (weight average molecular weight: 200,000). Under the same conditions as in Example I-1, this precursor was exposed, mounted in the Harris printing machine and then subjected to printing operations, thereby providing 15,000 sheets of scum-free, high-quality print.

EXAMPLE I-5

A heat-sensitive lithographic printing plate precursor was prepared in the same manner as in Example I-1, except that 1 g of the 10% ethylene glycol monomethyl ether solution of 2-hydroxyethyl methacrylate homopolymer was replaced by 2 g of a 10% ethylene glycol monomethyl ether solution of 2-hydroxyethyl methacrylate/acrylic acid (90/10 by weight %) copolymer (weight average molecular weight: 300,000). Under the same conditions as in Example I-3, this precursor was exposed, mounted in the Harris printing machine and then subjected to printing operations, thereby providing 20,000 sheets of scum-free, high-quality print.

EXAMPLES I-6 TO I-10

Similarly to the ink-receptive substrate prepared in Example I-1, ink-receptive substrates were each prepared as follows:

In place of the N-(p-aminosulfonylphenyl) methacrylamide copolymer used in Example I-1 were used a phenoxy resin "Phenototo YP-50" (trade name, a product of Toto Kasei K.K.) in Example I-6, a polyvinyl formal resin "Denka Formal #200" (trade name, a product of Electro Chemical Industry Co., Ltd.) in Example I-7, a polyurethane resin "Estan #5715" (trade name, a product of Monsanto Corp.) in Example I-8, a saturated copolyester resin "Kemmit K-1294" (trade name, a product of Toray Industries Inc.) in Example I-9, and methyl methacrylate/methacryloxypropyltriethoxysilane (60/40 by weight %) copolymer (weight average molecular weight: 85,000) in Example 1–10. Each resin was dissolved in an amount of 3.0 parts by weight in a mixed solvent constituted of 37 parts by weight of methyl ethyl ketone and 20 parts by weight of propylene glycol monomethyl ether, and thereto 0.04 parts by weight of a fluorine-containing surfactant "Megafac F-177" (trade name, a product of Dai-Nippon Ink & Chemicals, Inc.) was further added. Each solution thus prepared was coated on the aluminum substrate prepared in Example I-1 in a coating amount of 24 ml/m$^2$ by means of a bar coater. Thereafter, the coating was dried by 1-minute heating at 100° C., thereby forming the ink-receptive layer having a dry coverage of about 1 g/m$^2$ on the aluminum substrate. And heat-sensitive lithographic printing plate precursor were prepared in the same manner as in Example I-1, except that the substrate prepared in Example I-1 was replaced by the aluminum substrates prepared above respectively. Under the same conditions as in Example I-1, each of these plate precursors was exposed, mounted in the Harris printing machine, and then subjected to printing operations. As a result, 10,000 sheets of scum-free, high-quality print were obtained in each case.

EXAMPLE I-11

A heat-sensitive lithographic printing plate precursor was prepared in the same manner as in Example I-1, except that 0.2 mm-thick polyethylene terephthalate film was used in place of the aluminum substrate prepared in Example I-1. Under the same conditions as in Example I-1, this plate precursor was exposed, mounted in the Harris printing machine, and then subjected to printing operations. As a result, 10,000 sheets of scum-free, high-quality print were obtained.

EXAMPLE I-12

The coating composition described below was coated on the aluminum substrate prepared in Example I-1 in an amount of 24 $ml/m^2$ by means of a bar coater, and then dried at 100° C. for 1 minute, thereby forming an aluminum substrate provided with an ink-receptive layer at a dry coverage of about 1 $g/m^2$.

Coating Composition for Ink-receptive Layer

| | |
|---|---|
| N-(4-Hydroxyphenyl)methacrylamide/acrylonitrile/benzyl acrylate/methacrylic acid (26/13/49/12 by weight) copolymer (weight average molecular weight: 75,000) | 3 g |
| Hexafluorophosphate of 4-diazodiphenylamine-formaldehyde condensate | 0.3 g |
| Leuco Crystal Violet | 0.15 g |
| Methanol | 10 g |
| Ethylene glycol monomethyl ether | 17 g |

Then, the whole surface of the substrate thus formed was exposed by means of a 3 KW UV lamp to create a three-dimensionally cross-linked structure therein. The thus prepared substrate was used in place of the aluminum substrate coated with the ink-receptive layer of Example I-1. In the same manner as in Example I-1, except such a replacement, a heat-sensitive lithographic printing plate precursor was prepared.

Under the same conditions as in Example I-1, this plate precursor was exposed, mounted in the Harris printing machine, and then subjected to printing operations. As a result, 10,000 sheets of scum-free, high-quality print were obtained.

EXAMPLE I-13

On the substrate coated with the ink-receptive layer of Example I-1, a coating solution having the following composition was coated in an amount of 24 $ml/m^2$ , and dried at 100° C. for 1 minute to form a three-dimensionally cross-linked hydrophilic layer having a dry coverage of about 1 $g/m^2$. Further, this hydrophilic layer was coated with the same overcoat layer as in Example I-1 to prepare a heat-sensitive precursor of lithographic printing plate. Under the same conditions as in Example I-1, this plate precursor was exposed, mounted in the Harris printing machine, and then subjected to printing operations. As a result, 20,000 sheets of scum-free, high-quality print were obtained.

Coating Composition for Hydrophilic Layer

| | |
|---|---|
| 10% Ethylene glycol monomethyl ether solution of 2-hydroxyethyl methacrylate homopolymer (weight average molecular weight: 250,000) | 1 g |
| Methanol silica (30 weight % colloidal methanol solution of 10–20 nm silica particles, produced by Nissan Chemicals Industries, Ltd.) | 3 g |
| Aminopropyltriethoxysilane | 0.05 g |
| Methanol | 16 g |

EXAMPLE I-14

A heat-sensitive lithographic printing plate precursor was prepared in the same manner as in Example I-1, except that the coating solution having the following composition was used in place of the coating solution for the overcoat layer of Example I-1. Under the same conditions as in Example I-1, this printing plate precursor was exposed, mounted in the Harris printing machine, and then subjected to printing operations. As a result, 10,000 sheets of scum-free, high-quality print were obtained.

Coating Composition for Overcoat Layer

| | |
|---|---|
| 5% Solution of acrylic acid homopolymer (weight average molecular weight: 25,000) | 20 g |
| Water-soluble Cyanine Dye I-32 (illustrated in this specification) | 0.2 g |
| Polyoxyethylene nonyl phenyl ether | 0.025 g |

EXAMPLE I-15

An N-(p-aminosulfonylphenyl)methacrylamide/methyl methacrylate/acrylonitrile/2-hydroxymethyl methacrylate (40/10/30/20 by weight %) copolymer in an amount of 3 g was dissolved in a mixed solvent constituted of 50 g of ethylene glycol monomethyl ether and 47 g of methyl ethyl ketone, and coated in an amount of 20 $ml/m^2$ on the same aluminum substrate as used in Example I-1, followed by drying at 100° C. for 1 minute. Thus, the aluminum substrate provided with the ink-receptive layer at a dry coverage of about 0.6 $g/m^2$ was prepared.

Then, a sol solution was prepared by placing in a beaker 18 g of tetraethoxysilane, 32 g of ethanol, 32 g of purified water and 0.02 g of nitric acid and stirring them for 1 hour at room temperature. A coating solution constituted of a 3 g portion of the sol solution prepared above, 4 g of a 10% aqueous solution of polyvinyl alcohol “PVA 117” (trade name, a product of Kuraray Co., Ltd.), 8 g of a 20% aqueous solution of colloidal silica “Snowtex C” (trade name, a product of Nissan Chemicals Industries, Ltd.), 8 g of purified water and 0.04 g of polyoxyethylene nonyl phenyl ether was coated in an amount of 20 ml/m2 on the foregoing ink-receptive layer-coated aluminum substrate by means of a bar coater, and then dried at 100° C. for 5 minutes. Thus, a hydrophilic layer having a dry coverage of about 2 $g/m^2$ was formed. On this hydrophilic layer, the same overcoat layer as used in Example I-14 was provided in the same manner as in Example I-14 to prepare a heat-sensitive precursor of lithographic printing plate. This plate precursor was installed in a 40 W Trend Setter made by Canadian CREO Corp. (a plate setter equipped with a 40 W semiconductor laser emitting light of 830 nm), and thereto the laser energy of 600 $mJ/cm^2$ was applied. The thus exposed plate was mounted in the Harris printing machine, and subjected to printing operations. As a result, 40,000 sheets of scum-free, high-quality print were obtained.

EXAMPLE II-1

Preparation of Aluminum Substrate

An aluminum substrate was prepared in the same manner as in Example I-1.

Synthesis of Organic Polymer for Ink-receptive Layer

An organic polymer used for an ink-receptive layer was synthesized in the same manner as in Example I-1.

Preparation of Ink-receptive Substrate

The aluminum substrate having an ink-receptive layer was prepared in the same manner as in Example I-1.

Preparation of Heat-sensitive Precursor for Lithographic Printing Plate

A mixture of 1 g of a 10% ethylene glycol monomethyl ether solution of 2-hydroxyethyl methacrylate homopolymer (weight average molecular weight: 250,000), 3 g of methanol silica (a colloid containing 30 weight % of 10–20 nm silica particles in methanol, produced by Nissan Chemicals Industries, Ltd.), 0.08 g of Cyanine Dye (I-31) illustrated hereinbefore and 16 g of methanol was coated on the foregoing ink-receptive layer provided on the substrate, and then dried at 100° C. for 1 minute. Thus, the three-dimensionally cross-linked hydrophilic layer having a dry coverage of about 1 $g/m^2$ was formed on the ink-receptive layer.

On this hydrophilic layer, an aqueous solution constituted of 20 g of a 5% solution of polyacrylic acid (weight average molecular weight: 25,000), and 0.025 g of polyoxyethylene nonyl phenyl ether was coated, and then dried at 100° C. for 2 minutes, thereby forming an overcoat layer having a dry coverage of about 0.6 $g/m^2$ on the hydrophilic layer. Thus, a heat-sensitive lithographic printing plate precursor was prepared.

Preparation of Lithographic Printing Plate

The foregoing lithographic printing plate precursor was installed in a 40 W Trend Setter made by Canadian CREO Corp. (a plate setter equipped with a 40 W semiconductor laser emitting light of 830 nm), and thereto the laser energy of 300 $mJ/cm^2$ was applied. After irradiation, the plate surface was observed, and thereby it was confirmed that the energy applied areas bore almost no traces of scatter by ablation. The irradiated plate precursor was mounted in a Harris printing machine, and subjected to printing operations using an etch-containing 10 volume % aqueous solution of isopropyl alcohol as fountain solution in addition to ink. As a result, 10,000 sheets of scum-free, high-quality print were obtained.

Comparative Example II-1

A heat-sensitive lithographic printing plate precursor for comparison was prepared in the same manner as in Example II-1, except that the overcoat layer was not provided. Under the same conditions as in Example II-1, this printing plate precursor was irradiated with laser, mounted in the same printing machine, and then subjected to printing operations. After irradiation with laser, it was confirmed by observation of the plate surface that the hydrophilic layer caused an evident scatter by ablation in the irradiated areas. Although 10,000 sheets of print were obtained by printing operations, the printed sheets had fingerprint stains which were supposed to arise from the touch with ink-stained fingers upon mounting of the plate in the printing machine.

EXAMPLE II-2

A heat-sensitive precursor of lithographic printing plate was prepared in the same manner as in Example II-1, except that 3 g of the methanol silica was replaced by 4.5 g of a 20 weight % colloidal methanol solution of $ZrO_2.SiO_2$, Glassca 401 (trade name, a product of Nichiban Kenkyusho). This plate precursor was exposed under the same conditions as in Example II-1. After exposure, the plate surface was observed, and thereby it was confirmed that the energy-applied areas bore almost no traces of scatter by ablation. Then, the exposed plate precursor was mounted in a Harris printing machine, and subjected to printing operations under the same conditions as in Example II-1. As a result, 10,000 sheets of scum-free, high-quality print were obtained.

EXAMPLE II-3

A heat-sensitive precursor of lithographic printing plate was prepared in the same manner as in Example II-1, except that the amount of methanol silica used was changed to 4.5 g from 3 g, the amount of 10% ethylene glycol monomethyl ether solution of 2-hydroxyethyl methacrylate homopolymer used was changed to 1.5 g from 1 g and the Cyanine Dye (I-31) as light-heat converting agent was replaced by a Cyanine Dye (I-32) illustrated hereinbefore. The cross-linked hydrophilic layer of the thus prepared printing plate precursor had a dry coverage of about 1.5 $g/m^2$. This plate precursor was installed in a 40 W Trend Setter made by Canadian CREO Corp. (a plate setter equipped with a 40 W semiconductor laser emitting light of 830 nm), and thereto the laser energy of 450 $mJ/cm^2$ was applied. By the plate surface observation after irradiation, it was confirmed that there were almost no traces of scatter by ablation. The irradiated plate precursor was mounted in a Harris printing machine, and subjected to printing operations using an etch-containing 10 volume % aqueous solution of isopropyl alcohol as fountain solution in addition to ink. As a result, 25,000 sheets of scum-free, high-quality print were obtained.

EXAMPLE II-4

A heat-sensitive precursor of lithographic printing plate was prepared in the same manner as in Example II-1, except that 1 g of the 10% ethylene glycol monomethyl ether solution of 2-hydroxyethyl methacrylate homopolymer was replaced by 1 g of a 10% ethylene glycol monomethyl ether solution of 2-hydroxyethyl methacrylate/methyl methacrylate (70/30 by weight %) copolymer (weight average molecular weight: 200,000). This printing plate precursor was exposed under the same conditions as in Example II-1. By the plate surface observation after exposure, it was confirmed that there were almost no traces of scatter by ablation. Then, the exposed plate precursor was mounted in a Harris printing machine, and subjected to printing operations under the same conditions as in Example II-1. As a result, 15,000 sheets of scum-free, high-quality print were obtained.

EXAMPLE II-5

A heat-sensitive precursor of lithographic printing plate was prepared in the same manner as in Example II-1, except that 1 g of the 10% ethylene glycol monomethyl ether solution of 2-hydroxyethyl methacrylate homopolymer was replaced by 2 g of a 10% ethylene glycol monomethyl ether solution of 2-hydroxyethyl methacrylate/acrylic acid (90/10 by weight %) copolymer (weight average molecular weight: 300,000). This plate precursor was exposed under the same conditions as in Example II-3. By the plate surface observation after exposure, it was confirmed that there were almost no traces of scatter by ablation. Then, the exposed plate precursor was mounted in a Harris printing machine, and subjected to printing operations under the same conditions as in Example II-3. As a result, 20,000 sheets of scum-free, high-quality print were obtained.

EXAMPLES II-6 TO II-10

Overcoat layers were respectively provided in the same manner as in Example II-1, except that the polyacrylic acid was replaced by sodium polymethacrylate (weight average molecular weight: 15,000) in Example II-6, polyvinyl alcohol (saponification degree: 88 mole %, polymerization degree: 1,000) in Example II-7, poly(2-acrylamido-2-methyl-1-propanesulfonic acid) (weight average molecular weight: 15,000) in Example II-8 and polyacrylamide (weight average molecular weight: 10,000) in Example II-9, and in Example II-10 the 5% aqueous solution of polyacrylic acid was replaced by the mixture of a 4.5% aqueous solution of polyvinyl alcohol (saponification degree: 98.8 mole %, polymerizaion degree: 500) and a 0.5% aqueous solution of polyacrylic acid (weight average molecular weight: 25,000). The other constituents of each heat-sensitive lithographic printing plate precursor were the same as in Example II-1. Each of these plate precursors was irradiated with laser under the same conditions as in Example II-1. By the plate surface observation after irradiation, it was confirmed that there were almost no traces of scatter by ablation. Then, each of the irradiated plate precursors was mounted in a Harris printing machine, and subjected to printing operations under the same conditions as in Example II-1, thereby providing 10,000 sheets of scum-free, high-quality print.

EXAMPLES II-11 TO II-15

Similarly to the ink-receptive substrate prepared in Example II-1, ink-receptive substrates were each prepared as follows:

In place of the N-(p-aminosulfonylphenyl) methacrylamide copolymer used in Example II-1 were used a phenoxy resin "Phenototo YP-50" (trade name, a product of Toto Kasei K.K.) in Example II-11, a polyvinyl formal resin "Denka Formal #200" (trade name, a product of Electro Chemical Industry Co., Ltd.) in Example II-12, a polyurethane resin "Estan #5715" (trade name, a product of Monsanto Corp.) in Example II-13, a saturated copolyester resin "Kemmit K-1294" (trade name, a product of Toray Industries Inc.) in Example II-14, and methylmethacrylate/methacryloxypropyltriethoxysilane (60/40 by weight %) copolymer (weight average molecular weight: 85,000) in Example II-15. Each resin was dissolved in an amount of 3.0 parts by weight in a mixed solvent constituted of 37 parts by weight of methyl ethyl ketone and 20 parts by weight of propylene glycol monomethyl ether, and thereto 0.04 parts by weight of a fluorine-containing surfactant Megafac F-177 (trade name, a product of Dai-Nippon Ink & Chemicals, Inc.) was further added. Each solution thus prepared was coated on the aluminum substrate prepared in Example II-1 in a coating amount of 24 ml/m by means of a bar coater. Thereafter, the coating was dried by 1-minute heating at 100° C., thereby forming the ink-receptive layer having a dry coverage of about 1 $g/m^2$ on the aluminum substrate. And heat-sensitive lithographic printing plate precursor were prepared in the same manner as in Example II-1, except that the substrate prepared in Example II-1 was replaced by the substrates prepared above respectively. Under the same conditions as in Example II-1, each of these plate precursors was exposed, mounted in the Harris printing machine, and then subjected to printing operations. As a result, 10,000 sheets of scum-free, high-quality print were obtained in each case. Moreover, it was confirmed by the observation of each plate surface after irradiation that there were almost no traces of scatter by ablation.

EXAMPLES II-16 TO II-18

Ink-receptive substrates were prepared in the same manner as in Example II-1, except that their respective coating compositions for ink-receptive layer were different from that of Example II-1 in cyanine dye further added as light-heat converting agent.

More specifically, the formula of each coating composition was as follows:

| | |
|---|---|
| N-(p-Aminosulfonylphenyl)methacrylamide copolymer | 3 g |
| Cyanine dye | 0.3 g |
| γ-Butyrolactone | 9.5 g |
| Methyl lactate | 3 g |
| Methyl ethyl ketone | 22.5 g |
| Propylene glycol monomethyl ether | 22 g |

As to the foregoing cyanine dye, Cyanine Dyes (I-33), (I-34) and (I-37), which are illustrated hereinbefore, were used in Example II-16, Example II-17 and Example II-18 respectively.

On each of these ink-receptive substrates, the same hydrophilic layer and the same overcoat layer as in Example II-3 were coated. Each of the printing plate precursors thus prepared was exposed by means of the same plate setter as in Example II-1 so that the energy of 400mJ/$cm^2$ was applied thereto, and then mounted in the Harris printing machine, followed by printing operations As a result, 10,000 sheets of scum-free, high-quality print were obtained in each case. Moreover, the observation of each plate surface after exposure showed that there were almost no traces of scatter by ablation.

EXAMPLE II-19

A heat-sensitive lithographic printing plate precursor was prepared in the same manner as in Example II-1, except that 0.2 mm-thick polyethylene terephthalate film was used in place of the aluminum substrate prepared in Example II-1. Under the same conditions as in Example II-1, this plate precursor was exposed, mounted in the Harris printing machine, and then subjected to printing operations. As a result, 10,000 sheets of scum-free, high-quality print were obtained. In addition, the observation of the plate surface after exposure showed that there were almost no traces of scatter by ablation.

EXAMPLE II-20

The coating composition described below was coated on the aluminum substrate prepared in Example II-1 in an amount of 24 ml/$m^2$ by means of a bar coater, and then dried at 100° C. for 1 minute, thereby forming an aluminum substrate provided with an ink-receptive layer at a dry coverage of about 1 g/$m^2$.

Coating Composition for Ink-receptive Layer

| | |
|---|---|
| N-(4-Hydroxyphenyl)methacrylamide/acrylonitrile/benzyl acrylate/methacrylic acid (26/13/49/12 by weight) copolymer (weight average molecular weight: 75,000) | 3 g |
| Hexafluorophosphate of 4-diazodiphenylamine-Formaldehyde condensate | 0.3 g |
| Leuco Crystal Violet | 0.15 g |
| Methanol | 10 g |
| Ethylene glycol monomethyl ether | 17 g |

Then, the whole surface of the substrate thus formed was exposed by means of a 3 KW UV lamp to create a three-dimensionally cross-linked structure therein. The thus prepared substrate was used in place of the aluminum substrate coated with the ink-receptive layer of Example II-1. In the same manner as in Example II-1, except such a replacement, a heat-sensitive lithographic printing plate precursor was prepared.

Under the same conditions as in Example II-1, this printing plate precursor was exposed, mounted in the Harris printing machine, and then subjected to printing operations. As a result, 10,000 sheets of scum-free, high-quality print were obtained. In addition, the observation of the plate surface after exposure showed that there were almost no traces of scatter by ablation.

EXAMPLE II-21

On the substrate coated with the ink-receptive layer of Example II-1, a coating solution having the following composition was coated in an amount of 24 ml/$m^2$, and dried at 100° C. for 1 minute to form a three-dimensionally cross-linked hydrophilic layer having a dry coverage of about 1 g/$m^2$. Further, this hydrophilic layer was coated with the same overcoat layer as in Example II-1 to prepare a heat-sensitive precursor of lithographic printing plate. Under the same conditions as in Example II-1, this printing plate precursor was exposed, mounted in the Harris printing machine, and then subjected to printing operations. As a result, 20,000 sheets of scum-free, high-quality print were obtained. In addition, the observation of the plate surface after exposure showed that there were almost no traces of scatter by ablation.

Coating Composition for Hydrophilic Layer

| | |
|---|---|
| 10% Ethylene glycol monomethyl ether solution of 2-hydroxyethyl methacrylate homopolymer (weight average molecular weight: 250,000) | 1 g |
| Methanol silica (30 weight % colloidal methanol solution of 10–20 nm silica particles, produced by Nissan Chemicals Industries, Ltd.) | 3 g |
| Aminopropyltriethoxysilane | 0.05 g |
| Cyanine Dye (I-32) | 0.13 g |
| Methanol | 16 g |

EXAMPLE II-22

An N-(p-aminosulfonylphenyl)methacrylamide/methyl methacrylate/acrylonitrile/2-hydroxymethyl methacrylate (40/10/30/20 by weight %) copolymer in an amount of 3 g was dissolved in a mixed solvent constituted of 50 g of ethylene glycol monomethyl ether and 47 g of methyl ethyl ketone, and coated in an amount of 20 ml/$m^2$ on the same aluminum substrate as used in Example II-1, followed by drying at 100° C. for 1 minute. Thus, the aluminum substrate provided with the ink-receptive layer at a dry coverage of about 0.6 g/$m^2$ was prepared.

Then, a sol solution was prepared by placing in a beaker 18 g of tetraethoxysilane, 32 g of ethanol, 32 g of purified water and 0.02 g of nitric acid and stirring them for 1 hour at room temperature. A coating solution constituted of a 3 g portion of the sol solution prepared above, 4 g of a 10% aqueous solution of polyvinyl alcohol "PVA 117" (trade name, a product of Kuraray o., Ltd.), 8 g of a 20% aqueous solution of colloidal silica "Snowtex C" (trade name, a product of Nissan Chemicals Industries, Ltd.), 0.10 g of Cyanine Dye (I-31), 8 g of purified water and 0.04 g of polyoxyethylene nonyl phenyl ether was coated in an amount of 20 ml/$m^2$ on the foregoing ink-receptive layer-coated aluminum substrate by means of a bar coater, and then dried at 100° C. for 5 minutes. Thus, a hydrophilic layer having a dry coverage of about 2 g/$m^2$ was formed On this hydrophilic layer, the same overcoat layer as used in Example II-3 was provided in the same manner as in Example II-3 to prepare a heat-sensitive precursor of lithographic printing plate. This plate precursor was installed in a 40 W Trend Setter made by Canadian CREO Corp. (a plate setter equipped with a 40 W semiconductor laser emitting light of 830 nm), and thereto the laser energy of 600 mJ/$cm^2$ was applied. The thus exposed plate was mounted in the Harris printing machine, and subjected to printing operations. As a result, 40,000 sheets of scum-free, high-quality print were obtained. In addition, the observation of the plate surface after exposure showed that there were almost no traces of scatter by ablation.

ADVANTAGES OF THE INVENTION

The problems of conventional laser exposure-utilized heat-mode platemaking methods can be solved by according to embodiments of the present invention. More specifically, the present lithographic printing plate precursors have suitability for short-duration scanning exposure, and can be mounted in a printing machine without undergoing development-processing and subjected directly to printing operations. The printing plates made from the present precursors have great impression capacities and hardly develop scum.

Moreover, the heat-sensitive layers according to the invention can be inhibited from ablating (scattering) upon exposure to laser, so that the pollution of the exposure apparatus, including the optical system, by the scattered matter can be avoided effectively.

While the invention has been described in detail and with reference to specific embodiments thereof, it will be apparent to one skilled in the art that various changes and modifications can be made therein without departing from the spirit and scope thereof.

What is claimed is:

1. A heat-sensitive lithographic printing plate precursor comprising a hydrophilic layer provided on a substrate having an ink-receptive surface or coated with an ink-receptive layer; said plate precursor further having a water-soluble overcoat layer on the hydrophilic layer, and said hydrophilic layer being a three-dimensionally cross-linked hydrophilic layer, wherein upon heating said hydrophilic layer can be removed by a fountain solution or ink when subjected to printing operations, and wherein said overcoat layer comprises a light-heat converting agent.

2. The heat-sensitive lithographic printing plate precursor as in claim 1, wherein the substrate is coated with an ink receptive layer and at least one of the hydrophilic layer and the ink-receptive layer comprises a light-heat converting agent.

3. The heat-sensitive lithographic printing plate precursor as in claim 1 or 2 wherein the cross-linked hydrophilic layer comprises a colloid of at least one compound selected from the group consisting of oxides or hydroxides of beryllium, magnesium, aluminum, silicon, titanium, boron, germanium, tin, zirconium, iron, vanadium, antimony and transition metals.

4. The heat-sensitive lithographic printing plate precursor as in claim 3, wherein the colloid is a sol comprising a hydrolytic condensation product of dialkoxysilane, trialkoxysilane, tetraalkoxysilane or a mixture thereof.

5. The heat-sensitive lithographic printing plate precursor as in claim 3, wherein the colloid is a sol comprising a hydrolytic condensation product of aluminum, titanium or zirconium tetraalkoxide.

6. The heat-sensitive lithographic printing plate precursor as in claim 3, wherein the colloid is a colloid containing an organic solvent solution.

7. The heat-sensitive lithographic printing plate precursor as in claim 6, wherein the organic solvent is methanol or ethanol.

8. The heat-sensitive lithographic printing plate precursor as in claim 1 or 2, wherein the cross-linked hydrophilic layer comprises a colloid of at least one compound selected from the group consisting of oxides or hydroxides of beryllium, magnesium, aluminum, silicon, titanium, boron, germanium, tin, zirconium, iron, vanadium, antimony and transition metals, and a hydrophilic resin.

9. The heat-sensitive lithographic printing plate precursor as in claim 8, wherein the hydrophilic resin is a high molecular compound having hydroxyl groups or carboxyl groups.

10. The heat-sensitive lithographic printing plate precursor as in claim 8, wherein the hydrophilic resin is a hydroxyalkylacrylate homo- or copolymer or a hydroxyalkylmethacrylate homo- or copolymer.

11. The heat-sensitive lithographic printing plate precursor as in claim 1 or 2, wherein the cross-linked hydrophilic layer comprises a colloid of at least one compound selected from the group consisting of oxides or hydroxides of beryllium, magnesium, aluminum, silicon, titanium, boron, germanium, tin, zirconium, iron, vanadium, antimony and transition metals, and a cross-linking agent for the colloid.

12. The heat-sensitive lithographic printing plate precursor as in claim 11, wherein the cross-linking agent is an initial hydrolytic condensation product of tetraalkoxysilane, trialkoxysilylpropyl-N,N,N-trialkyl-ammonium halide or aminopropyltrialkoxysilane.

13. The heat-sensitive lithographic printing plate precursor as in claim 1 or 2 wherein the cross-linked hydrophilic layer comprises a colloid of at least one compound selected from the group consisting of oxides or hydroxides of beryllium, magnesium, aluminum, silicon, titanium, boron, germanium, tin, zirconium, iron, vanadium, antimony and transition metals, a hydrophilic resin and a cross-linking agent for the colloid.

14. The heat-sensitive lithographic printing plate precursor as in claim 1 or 2, wherein the substrate is a polyethylene terephthalate or polycarbonate film.

15. The heat-sensitive lithographic printing plate precursor as in claim 1 or 2, wherein the substrate is an aluminum or steel sheet coated with an ink-receptive organic high molecular resin.

16. The heat-sensitive lithographic printing plate precursor as in claim 1 or 2, wherein the substrate is an aluminium or steel sheet laminated with an oleophilic plastic film.

17. The heat-sensitive lithographic printing plate precursor as in claim 1 or 2, wherein the substrate is a paper coated with an ink-receptive organic polymer or a paper laminated with an oleophilic plastic film.

18. The heat-sensitive lithographic printing plate precursor as in claim 1 or 2, wherein the overcoat layer comprises a light-heat converting agent and a water-soluble resin.

19. The heat-sensitive lithographic printing plate precursor as in claim 1 or 2, wherein the overcoat layer has a thickness of from 0.05 to 4.0 $\mu$m.

20. The heat-sensitive lithographic printing plate precursor as in claim 1 or 2, wherein the cross-linked hydrophilic layer has a thickness of from 0.1 to 3 $\mu$m.

21. The heat-sensitive lithographic printing plate precursor as in claim 1, wherein the light-heat converting agent is a water-soluble dye having absorption in the infrared region or a pigment having the surface covered with a water-soluble compound.

22. The heat-sensitive lithographic printing plate precursor as in claim 21, wherein the light-heat converting agent is a water-soluble dye having absorption in the infrared region and is a cyanine dye having at least one group selected from the group consisting of sulfonic acid group, alkali metal salts thereof and amine salt thereof.

* * * * *